US012622328B2

(12) United States Patent
Jeong et al.

(10) Patent No.: US 12,622,328 B2
(45) Date of Patent: May 5, 2026

(54) DISPLAY APPARATUS

(71) Applicant: SAMSUNG ELECTRONICS CO., LTD., Suwon-si (KR)

(72) Inventors: Juyeon Jeong, Suwon-si (KR); Mihyun Kim, Suwon-si (KR); Sihan Kim, Suwon-si (KR); Hankyu Seong, Suwon-si (KR); Jusong Eom, Suwon-si (KR); Jihye Yeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 444 days.

(21) Appl. No.: 18/223,854

(22) Filed: Jul. 19, 2023

(65) Prior Publication Data

US 2024/0030210 A1 Jan. 25, 2024

(30) Foreign Application Priority Data

Jul. 19, 2022 (KR) ........................ 10-2022-0088761

(51) Int. Cl.
H10H 29/49 (2025.01)
H10H 29/14 (2025.01)
(Continued)

(52) U.S. Cl.
CPC .......... H10W 90/00 (2026.01); H10H 29/142 (2025.01); H10H 29/49 (2025.01);
(Continued)

(58) Field of Classification Search
CPC .. H10H 29/49; H10H 20/812; H10K 59/1275; H10K 59/1315; H10K 59/80522
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

CN 113571623 A 10/2021
KR 10-2022-0014612 A 2/2022
(Continued)

OTHER PUBLICATIONS

Communication issued Jun. 23, 2023 by the European Patent Office in European Patent Application No. 19893413.5.

*Primary Examiner* — Abdulmajeed Aziz
*Assistant Examiner* — Steven Y Horikoshi
(74) *Attorney, Agent, or Firm* — Sughrue Mion, PLLC

(57) ABSTRACT

A display apparatus includes: a circuit board including a driving circuit; and a pixel array disposed on the circuit board and including pixels, each of the pixels having a plurality of sub-pixels. The pixel array includes: a semiconductor stack, a conductive partition structure and wavelength conversion portions. The semiconductor stack includes LED cells respectively constituting the plurality of sub-pixels. Each of the LED cells includes at least an active layer and a second conductivity-type semiconductor layer. The conductive partition structure is provided between sub-pixel spaces, respectively overlaps the LED cells on the semiconductor stack, and is provided as a first electrode. The wavelength conversion portions are respectively disposed on the sub-pixel spaces.

20 Claims, 23 Drawing Sheets

(51) Int. Cl.
  _H10W 90/00_     (2026.01)
  _H10W 72/20_     (2026.01)
  _H10W 72/30_     (2026.01)
  _H10W 74/15_     (2026.01)

(52) U.S. Cl.
  CPC ........ _H10W 72/242_ (2026.01); _H10W 72/252_ (2026.01); _H10W 72/344_ (2026.01); _H10W 72/353_ (2026.01); _H10W 74/15_ (2026.01); _H10W 90/722_ (2026.01); _H10W 90/732_ (2026.01)

(56)              References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 10,403,608 B2 | 9/2019 | Sim et al. | |
| 10,700,246 B2 | 6/2020 | Sim et al. | |
| 10,797,212 B2 | 10/2020 | Im et al. | |
| 11,094,846 B1 | 8/2021 | Khalid et al. | |
| 11,107,861 B2 | 8/2021 | Youn et al. | |
| 2006/0124949 A1* | 6/2006 | Park | H10K 59/8723 257/E27.111 |
| 2013/0142418 A1 | 6/2013 | van Zwol et al. | |
| 2016/0043343 A1* | 2/2016 | Zhang | H10K 59/80522 257/40 |
| 2017/0141347 A1* | 5/2017 | Li | H10K 59/122 |
| 2018/0166424 A1* | 6/2018 | Sim | H10H 20/853 |
| 2020/0203559 A1* | 6/2020 | Kong | H10K 59/1201 |
| 2020/0343410 A1 | 10/2020 | Iguchi | |
| 2020/0359499 A1* | 11/2020 | Hwu | H05K 1/028 |
| 2021/0005794 A1 | 1/2021 | Sakong et al. | |
| 2021/0111319 A1 | 4/2021 | Lutgen et al. | |
| 2021/0159370 A1 | 5/2021 | Hsu et al. | |
| 2021/0167248 A1* | 6/2021 | Yang | H01L 25/0753 |
| 2021/0226155 A1* | 7/2021 | Li | H10K 59/80522 |
| 2021/0408327 A1 | 12/2021 | Tak et al. | |
| 2022/0093833 A1 | 3/2022 | Takiguchi et al. | |
| 2023/0037888 A1 | 2/2023 | Yeon | |
| 2023/0215856 A1 | 7/2023 | Kim et al. | |
| 2023/0282631 A1 | 9/2023 | Jeong et al. | |

FOREIGN PATENT DOCUMENTS

| | | |
|---|---|---|
| KR | 10-2023-0020236 A | 2/2023 |
| KR | 10-2023-0105442 A | 7/2023 |
| KR | 10-2023-0116308 A | 8/2023 |

* cited by examiner

DISPLAY APPARATUS

CROSS-REFERENCE TO RELATED APPLICATION

This application claims priority to Korean Patent Application No. 10-2022-0088761, filed on Jul. 19, 2022, in the Korean Intellectual Property Office, the disclosure of which is incorporated by reference herein in its entirety.

BACKGROUND

The present disclosure relates to a display apparatus including a micro-LED.

Semiconductor light-emitting diodes (LEDs) have been used as light sources for lighting devices, and other electronic products. For example, semiconductor LEDs have widely been used as light sources for various display apparatuses such as televisions (TVs), mobile phones, personal computers (PCs), laptop computers, personal digital assistants (PDAs), or the like.

Display apparatuses according to the related art include display panels, such as liquid crystal display (LCD) panels, and backlight units. Some display apparatuses use LEDs as pixels and do not require separate backlight units. Such a display apparatus may have a compact size, and may be implemented as a high-luminance display apparatus having improved optical efficiency, as compared with LCDs.

SUMMARY

Example embodiments provide a display apparatus having improved uniform light emission over an entire region.

According to an example embodiment, a display apparatus includes: a circuit board including a driving circuit; and a pixel array including a plurality of pixels provided on the circuit board, each of the plurality of pixels having a plurality of sub-pixels. The pixel array includes: a semiconductor stack including a first conductivity-type semiconductor layer having an upper surface provided as a light emission surface and LED cells arranged on a lower surface of the first conductivity-type semiconductor layer, the LED cells respectively constituting the plurality of sub-pixels, and each of the LED cells including an active layer and a second conductivity-type semiconductor layer stacked sequentially on the lower surface of the first conductivity-type semiconductor layer; a conductive partition structure between sub-pixel spaces, respectively overlapping the LED cells, on the semiconductor stack, connected to an upper surface of the first conductivity-type semiconductor layer, and provided as a first electrode; wavelength conversion portions, respectively provided in the sub-pixel spaces; a common electrode provided on at least one side of an upper surface of the semiconductor stack and electrically connected to an edge region of the conductive partition structure and the driving circuit; second electrodes, respectively provided on lower surfaces of the LED cells and connected to the second conductivity-type semiconductor layer, each of the second electrodes being electrically connected to the driving circuit; and a pad electrode provided on an outer side of the common electrode and electrically connected to the driving circuit.

According to an example embodiment, a display apparatus includes: a circuit board including a driving circuit; and a pixel array including a plurality of pixels provided on the circuit board, each of the plurality of pixels having a plurality of sub-pixels. The pixel array includes: a semiconductor stack including a first conductivity-type semiconductor layer having an upper surface provided as a light emission surface and LED cells arranged on a lower surface of the first conductivity-type semiconductor layer, the LED cells respectively constituting the plurality of sub-pixels, and each of the LED cells including an active layer and a second conductivity-type semiconductor layer stacked sequentially on the lower surface of the first conductivity-type semiconductor layer; a conductive partition structure between sub-pixel spaces, respectively overlapping the LED cells, on the semiconductor stack, connected to an upper surface of the first conductivity-type semiconductor layer, and provided as a first electrode, wherein textured regions of the first conductivity-type semiconductor layer, respectively exposed by the sub-pixel spaces, have textured surfaces; a transparent insulating layer provided on an upper surface and sidewalls of the conductive partition structure and in the textured regions of the first conductivity-type semiconductor layer exposed by the sub-pixel spaces; wavelength conversion portions, respectively provided in the sub-pixel spaces; a common electrode provided on at least one side of an upper surface of the semiconductor stack and electrically connected to an edge region of the conductive partition structure and the driving circuit; second electrodes, respectively provided on lower surfaces of the LED cells and connected to the second conductivity-type semiconductor layer, each of the second electrodes being electrically connected to the driving circuit; and a pad electrode provided on an outer side of the common electrode and electrically connected to the driving circuit.

According to an example embodiment, a display apparatus includes: a circuit board including a driving circuit, a lower bonding insulating layer covering the driving circuit, and first to third lower bonding electrodes penetrating through the lower bonding insulating layer and electrically connected to the driving circuit; and a pixel array including a plurality of pixels provided on the circuit board, each of the plurality of pixels having a plurality of sub-pixels. The pixel array includes: a semiconductor stack including a first conductivity-type semiconductor layer having an upper surface provided as a light emission surface and LED cells arranged on a lower surface of the first conductivity-type semiconductor layer, the LED cells respectively constituting the plurality of sub-pixels, and each of the LED cells including at least an active layer and a second conductivity-type semiconductor layer stacked sequentially on the lower surface of the first conductivity-type semiconductor layer; a conductive partition structure between sub-pixel spaces, respectively overlapping the LED cells, on the semiconductor stack, connected to an upper surface of the first conductivity-type semiconductor layer, and provided as a first electrode; wavelength conversion portions, respectively provided on the sub-pixel spaces; a common electrode provided on at least one side of an upper surface of the semiconductor stack and electrically connected to an edge region of the conductive partition structure and the driving circuit; a pad electrode provided on the same level as the common electrode; a wiring insulating layer provided on a lower surface of the semiconductor stack to cover the LED cells; second electrodes, respectively provided on lower surfaces of the LED cells and connected to the second conductivity-type semiconductor layer; an upper bonding insulating layer provided on the wiring insulating layer and contacting the lower bonding insulating layer; a first upper bonding electrode connected to the common electrode through the upper bonding insulating layer and the wiring insulating layer, and connected to the first lower bonding electrode; second upper bonding electrodes, respectively connected to the second electrodes through the upper bonding insulating layer and the wiring insulating layer, and respectively connected to the second lower bonding electrodes; and a third upper bonding electrode connected to the pad electrode by the upper bonding insulating layer and the wiring insulating layer and connected to the third lower bonding electrode.

BRIEF DESCRIPTION OF DRAWINGS

The above and other aspects, features, and advantages of the present disclosure will be more apparent from the following description of example embodiments, taken in conjunction with the accompanying drawings, in which.

DETAILED DESCRIPTION

Figure 1:
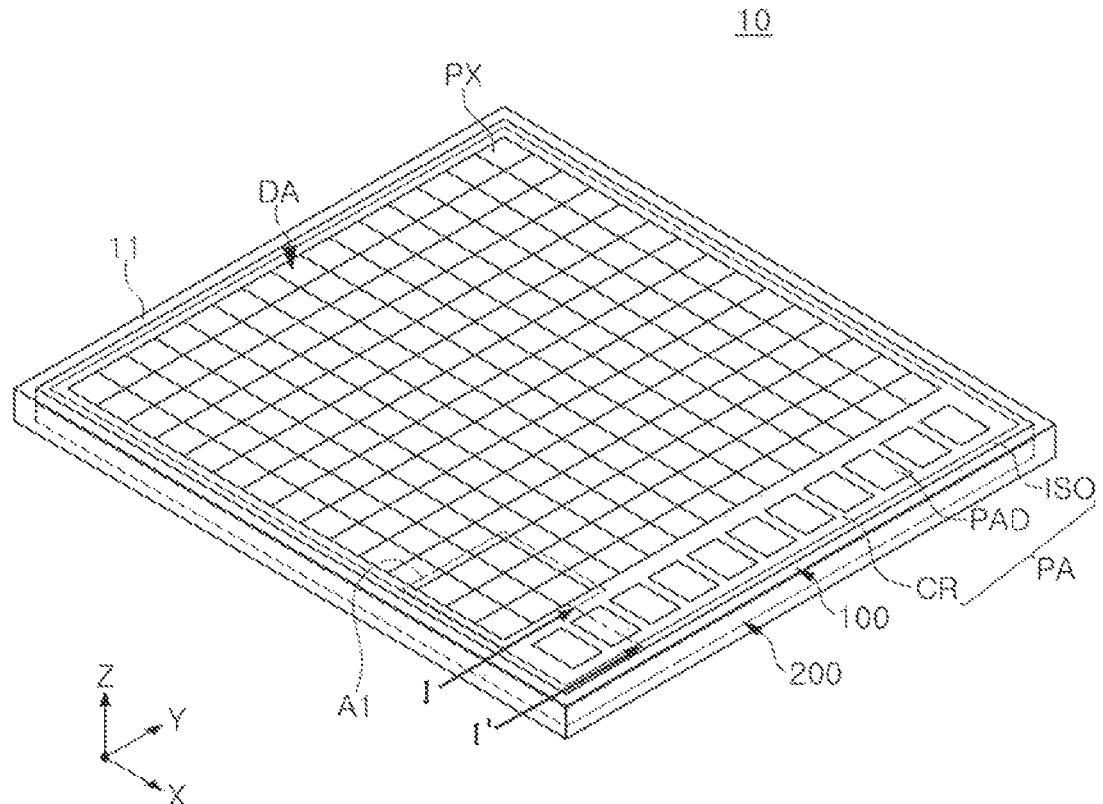
FIG. 1 is a schematic perspective view of a display apparatus according to an example embodiment.

Hereinafter, example embodiments will be described with reference to the accompanying drawings.

Hereinafter, example embodiments will be described with reference to the accompanying drawings. In the descriptions below, terms "upper," "upper portion," "upper surface," "lower," "lower portion," "lower surface," "side surface," and the like, are used with reference to the diagrams unless otherwise indicated. The same or similar reference numerals may refer to the same elements throughout. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be understood that when an element or layer is referred to as being "on," "connected to" or "coupled to" another element or layer, it can be directly on, connected or coupled to the other element or layer, or intervening elements or layers may be present.

By contrast, when an element is referred to as being "directly on," "directly connected to" or "directly coupled to" another element or layer, there are no intervening elements or layers present.

Figure 2:
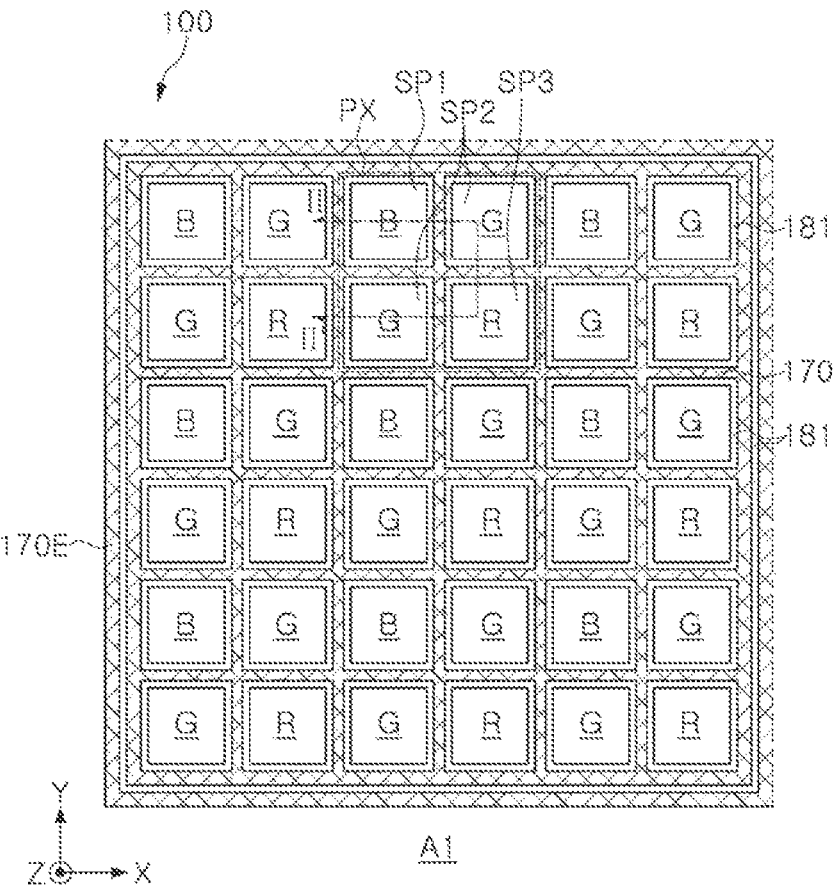
FIG. 2 is a partially enlarged plan view of portion "A1" of a display apparatus according to an example embodiment.

FIG. 1 is a schematic perspective view of a display apparatus according to an example embodiment, and FIG. 2 is a partially enlarged plan view of a region "A1" of the display apparatus of FIG. 1.

Referring to FIGS. 1 and 2, a display apparatus 10 may include a circuit board 200, including driving circuits, and a pixel array 100 disposed on the circuit board 200 and in which a plurality of pixels PX are arranged. The display apparatus 10 may further include a frame 11 surrounding the circuit board 200 and the pixel array 100.

The circuit board 200 may include a driving circuit including thin film transistor (TFT) cells. In some example embodiments, the circuit board 200 may further include other driving circuits, in addition to driving circuits for a display apparatus. In some example embodiments, the circuit board 200 may include a flexible substrate, and the display apparatus 10 may be implemented as a display apparatus having a curved profile.

The pixel array 100 may include a display area DA and a peripheral area PA on at least one side of the display area DA. The display area DA may include an LED module for display. The pixel array 100 may include a display area DA in which a plurality of pixels PX are arranged. The peripheral area PA may include pad region PAD, a connection region CR connecting the plurality of pixels PX and the pad regions PAD to each other, and an edge region ISO.

Each of the plurality of pixels PX may include first to third sub-pixels SP1, SP2, and SP3 configured to emit light having a specific wavelength, for example, a specific color to provide a color image. For example, the first to third sub-pixels SP1, SP2, and SP3 may be configured to emit blue (B) light, green (G) light, and red (R) light, respectively. In some example embodiments, in each pixel PX (also referred to as a "pixel unit"), the first to third sub-pixels SP1, SP2, and SP3 may be arranged in a Bayer pattern.

For example, as illustrated in FIG. 2, each pixel PX may include first and third sub-pixels SP1 and SP3 (for example, a blue (B) color and a red (R) color), arranged in a first diagonal direction, and two second sub-pixels SP2 (for example, a green (G) color) arranged in a second diagonal direction, intersecting the first diagonal direction. As illustrated, each pixel PX may be provided in a form in which the first to third sub-pixels SP1, SP2, and SP3 are arranged in a 2-by-2 Bayer pattern, but example embodiments are not limited thereto. In other example embodiments, each pixel PX may include sub-pixels provided in other arrangements such as 3-by-3 or 4-by-4. In some example embodiments, each pixel PX may include a sub-pixel configured to emit light of a color different from the above-mentioned colors R, G, and B, for example, yellow light. In the pixel array 100 of FIG. 1, the plurality of pixels PX are illustrated as a 15-by-15 array, but the number of rows and columns may be implemented as an appropriate number, for example, 1024 by 768, or the like. For example, the plurality of pixels PX may have multiple arrays depending on a desired resolution.

The pad regions PAD may be disposed on at least one side of the plurality of pixels PX along an edge of the display apparatus 10. The pad region PAD may be electrically connected to the plurality of pixels PX and driving circuits of the circuit board 200. The pad regions PAD may electrically connect an external device and the display apparatus 10 to each other. The number of the pad regions PAD may vary according to example embodiments. For example, the number of the pad regions PAD may be determined depending on the number of pixels PX, a method of driving a TFT circuit in the circuit board 200, or the like.

The connection region CR may be disposed between the plurality of pixels PX and the pad regions PAD. A wiring structure, which may be electrically connected to the plurality of pixels PX, for example, a common electrode 145 may be disposed in the connection region CR (see FIG. 3). The edge region ISO may be a region formed along edges of the pixel array 100.

The frame 11 may be disposed around the pixel array 100 to be provided as a guide defining a space in which the pixel array 100 is disposed. The frame 11 may include, for example, at least one material, among a polymer, a ceramic, a semiconductor, or a metal. For example, the frame 11 may include a black matrix. However, the frame 11 is not limited to the black matrix, and may include a white matrix or a structure of another color depending on the purpose of the display apparatus 10. For example, the white matrix may include a reflective material or a scattering material. In FIG. 1, the display apparatus 10 is illustrated as having a rectangular planar structure, but may have another shape according to example embodiments.

Figure 3:
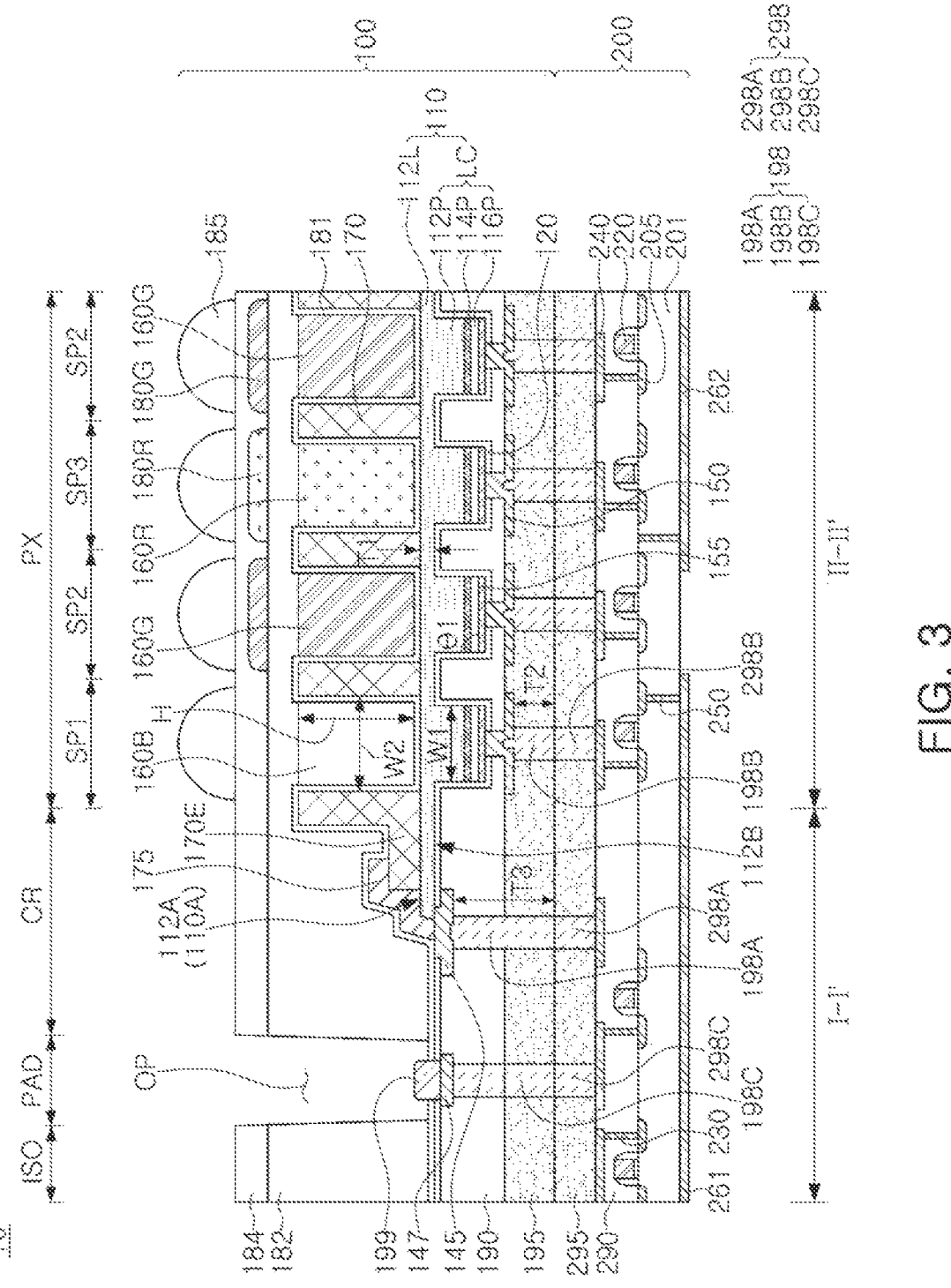
FIG. 3 is a schematic cross-sectional view of a display apparatus according to an example embodiment.

FIG. 3 illustrates a schematic cross-section of a display apparatus according to an example embodiment, and the schematic cross-section may be understood to be a combination of a cross-section taken along line I-I' of FIG. 1 (the peripheral area PA) and a cross-section taken along line II-II' of FIG. 2 (the display area DA).

Referring to FIG. 3, a display apparatus 10 according to an example embodiment may include a circuit board 200 and a pixel array 100 disposed on the circuit board 200.

The circuit board 200 may include a semiconductor substrate 201, a driving circuit including driving elements 220 including TFT cells formed on the semiconductor substrate 201, interlayer connection portions 230 electrically connected to the driving elements 220, circuit wiring lines 240 on the interlayer connection portions 230, and a circuit insulating layer 290 covering the driving circuit.

According to an example embodiment, the circuit board 200 may further include a lower bonding insulating layer 295 on the circuit insulating layer 290 and a lower bonding electrode 298 disposed in the lower bonding insulating layer 295 and connected to the circuit wiring lines 240.

The semiconductor substrate 201 may include impurity regions including source/drain regions 205. The semiconductor substrate 201 may include, for example, a semiconductor such as silicon (Si) or germanium (Ge), or a compound semiconductor such as SiGe, SiC, GaAs, InAs, or InP. The semiconductor substrate 201 may further include through-electrodes 250 such as a through-silicon via (TSV), connected to the driving circuit, and first and second substrate wiring lines 261 and 262 connected to the through-electrodes 250.

The driving circuit may include a circuit controlling driving of a pixel, for example, a sub-pixel. The source region 205 of the TFT cells may be electrically connected to one side electrode of the LED cells LC through the interlayer connection portion 230, the circuit wiring line 240, and the lower bonding electrodes 298. For example, a drain region 205 of the TFT cells may be connected to the first substrate wiring line 261 through the through-electrode 250, and the first substrate wiring line 261 may be connected to a data line. Gate electrodes of the TFT cells may be connected to the second substrate wiring line 262 through the through-electrode 250, and the second substrate wiring line 262 may be connected to the gate line. Such a circuit configuration and operation will be described later in more detail with reference to FIG. 4.

Upper surfaces of the lower bonding electrodes 298 and upper surfaces of the lower bonding insulating layer 295 may constitute an upper surface of the circuit board 200. Lower surfaces of the upper bonding electrodes 198 and lower surfaces of the upper bonding insulating layer 195 may constitute a lower surface of the pixel array 100. The lower bonding electrodes 298 of the circuit board 200 may be respectively bonded to the upper bonding electrodes 198 of the pixel array 100 to provide an electrical connection path. The lower bonding insulating layer 295 of the circuit board 200 may be bonded to the upper bonding insulating layer 195 of the pixel array 100.

For example, a first upper bonding electrode 198A may connect the common electrode 145, a portion of a first electrode structure of LED cells LC, to a first lower bonding electrode 298A, and a second upper bonding electrode 198B may respectively connect second electrodes 150 of the LED cells LC to second lower bonding electrodes 298B. A third upper bonding electrode 198C may connect a pad electrode 147 to a third lower bonding electrode 298C.

The lower bonding electrodes 298 may include a conductive material, for example, copper (Cu). The lower bonding insulating layer 295 may be bonded to the upper bonding insulating layer 195 of the pixel array 100. For example, the lower bonding insulating layer 295 may include at least one of SiO, SiN, SiCN, SiOC, SiON, or SiOCN.

The pixel array 100 may include a semiconductor stack 110. The semiconductor stack 110 may be understood to include epitaxial layers continuously grown on a single growth substrate. The semiconductor stack 110 may include a first conductivity-type semiconductor layer 112L, having an upper surface 112A provided as a light emitting surface, and LED cells LC arranged on a lower surface 112B of the first conductivity-type semiconductor layer 112L and respectively constituting the sub-pixels SP1, SP2, and SP3. Each of the LED cells LC may include at least an active layer 114P and a second conductivity-type semiconductor layer 116P, sequentially stacked on the lower surface 112B of the first conductivity-type semiconductor layer 112L. Each of the LED cells LC may further include a first conductivity-type semiconductor layer portion 112P below the active layer 114P. The first conductivity-type semiconductor layer portion 112P may include the same material as the first conductivity-type semiconductor layer 112L. The LED cells LC may be understood to be a structure obtained through mesa etching from continuously grown epitaxial layers to a region of the first conductivity-type semiconductor material layer 112 together with the second conductivity-type semiconductor material layer 116 (see FIGS. 5A and 5B).

As described above, the pixel array 100 may include a display area DA in which a plurality of pixels PX are arranged, and each of the plurality of pixels PX may include first to third sub-pixels SP1, SP2, and SP3 arranged according to a predetermined pattern (for example, a Bayer pattern). Each of the plurality of LED cells LC may be a micro-LED structure and may be formed to correspond to each of the first to third sub-pixels SP1, SP2, and SP3. The LED cells LC may be arranged in a plurality of rows and a plurality of columns in plan view (see FIG. 2).

Each of the LED cells LC may include an active layer 114P configured to emit light, for example, blue light having a wavelength of 435 nm to 460 nm. The active layer 114P and the second conductivity-type semiconductor layer 116P may be separated in units of LED cells LC, whereas the first conductivity-type semiconductor layer 112L may be provided as a single layer to be shared by the plurality of LED cells LC. As illustrated in FIG. 3, a portion 112P (for example, a lower region) of the first conductivity-type semiconductor layer may be separated in units of LED cells LC, together with the second conductivity-type semiconductor layer 116P and the active layer 114P. However, remaining regions (for example, upper regions) of the first conductivity-type semiconductor layer 112L may be configured to be connected to each other between the plurality of LED cells LC without being separated.

The first conductivity-type semiconductor layer 112L may be shared not only by the LED cells LC, constituting the first to third sub-pixels SP1, SP2, and SP3, but also by LED cells LC of other pixels PX. An upper surface 112A of the shared first conductivity-type semiconductor layer 112L may be provided as a contact region for each LED cell LC. The conductive partition structure 170 may be formed on the upper surface 112A of the first conductivity-type semiconductor layer 112L to directly contact the upper surface 112A, and may be provided as a first electrode for each LED cell LC.

The first conductivity-type semiconductor layer 112L may have a single layer structure having a predetermined thickness to provide a common contact region for each of the LED cells LC. A thickness T1 of the first conductivity-type semiconductor layer 112L may be, for example, about 0.1 micrometers ($\mu$m) or more. To reduce leakage of light, emitted from the LED cell LC, to another sub-pixel, the thickness T1 of the first conductivity-type semiconductor layer 112L may be reduced. In some example embodiments, the thickness T1 of the first conductivity-type semiconductor layer 112L may be within a range of about 0.1 $\mu$m to about 2.0 $\mu$m and, in detail, a range of about 0.1 $\mu$m to about 1.0 $\mu$m.

The first conductivity-type semiconductor layer 112L, the active layer 114P, and the second conductivity-type semiconductor layer 116P may be nitride epitaxial layers. The first conductivity-type semiconductor layer 112L and the second conductivity-type semiconductor layer 116P may be nitride semiconductor layers having N-type and P-type compositions of $In_xAl_yGa_{1-x-y}N(0 \le Âx<1, 0 \le y<1, 0 \le x+y<1)$, respectively. For example, the first conductivity-type semiconductor layer 112L may be N-type gallium nitride (n-GaN) layers doped with silicon (Si), germanium (Ge), or carbon (C), and the second conductivity-type semiconductor layer 116P may be P-type gallium nitride (p-GaN) layer doped with magnesium (Mg) or zinc (Zn). In some example embodiments, the first conductivity-type semiconductor layer 112L and the second conductivity-type semiconductor layer 116P may include a semiconductor layer based on aluminum indium gallium phosphide (AlInGaP) or aluminum indium gallium arsenide (AlInGaAs), other than the nitride semiconductor. Each of the first conductivity-type semiconductor layer 112L and the second conductivity-type semiconductor layer 116P may include a single layer, or may include a plurality of layers having different characteristics such as a doping concentration, a composition, or the like.

The active layer 114P may emit light having predetermined energy through recombination of electrons and holes. The active layer 114P may have a single quantum well (SQW) structure or a multiple quantum well (MQW) structure in which quantum barrier layers and quantum well layers are alternately disposed. For example, the quantum well layer and the quantum barrier layer may be $In_xAl_yGa_{1-x-y}N(0 \le x \le 1, 0 \le y \le 1, 0 \le x+y \le 1)$ layers having different compositions. For example, the quantum well layer may be an $In_xGa_{1-x}N(0<x \le 1)$ layer, and the quantum barrier layer may be a GaN layer or an AlGaN layer.

As described above, the first conductivity-type semiconductor layer 112L may include a nitride epitaxial layer continuously grown with the first conductivity-type semiconductor layer portion 112P, the active layer 114P, and the second conductivity-type semiconductor layer 116P.

In each of the LED cells LC, an angle $\theta 1$ between a lower surface and side surfaces may be a right angle or an angle, similar to the right angle. For example, the angle $\theta 1$ may range from about 85 degrees to about 95 degrees. The LED cells LC may be obtained by sequentially performing a dry etching process and a wet etching process (see FIG. 5B).

A conductive partition structure 170 may be formed on the upper surface 110A of the semiconductor stack 110, for example, the upper surface 112A of the first conductivity-type semiconductor layer 112L. The conductive partition structure 170 may be formed to define a plurality of sub-pixel spaces (see W of FIG. 6C) in regions corresponding to the plurality of LED cells LC. As illustrated in FIG. 3, each of the plurality of sub-pixel spaces may be disposed on the upper surface 110A of the semiconductor stack 110 to correspond to each of the plurality of LED cells LC. Each of the sub-pixel spaces may have vertical or inclined side surfaces in a direction (for example, a Z-direction), perpendicular to the upper surface 110A of the semiconductor stack 110. For example, in some example embodiments, each of the sub-pixel spaces may have inclined side surfaces such that a width of an upper portion is narrower than a width of a lower portion.

In some example embodiments, a width W1 of the LED cell LC may be greater than a width W2 of the sub-pixel space. A height H of the sub-pixel space may be at least twice the width W2 of the sub-pixel space.

As described above, the upper surface 112A of the first conductivity-type semiconductor layer 112L may be provided as a contact region. The conductive partition structure 170 may be disposed on the upper surface 112A of the first conductivity-type semiconductor layer 112L, the lower surface of the conductive partition structure 170 and the upper surface 112A of the first conductivity-type semiconductor layer 112L may directly contact each other. In such an arrangement, the conductive partition structure 170 may be provided as a first electrode for each LED cell LC.

The conductive partition structure 170 may include a metal material for ohmic contact with the first conductivity-type semiconductor layer 112L. The conductive partition structure 170 including such a metal material may be provided as a light blocking structure to prevent light interference from occurring between the sub-pixels SP1, SP2, and SP3. For example, the conductive partition structure 170 may include at least one selected from the group consisting of Ag, Cr, Ni, Ti, Al, Rh, Ru, or combinations thereof.

The conductive partition structure 170 may be provided as a single-layer or multilayer structure. For example, the conductive partition structure 170 may have a double-layer structure including an ohmic contact layer, contacting the first conductivity-type semiconductor layer 112L, and a reflective electrode layer disposed on the ohmic contact layer.

The conductive partition structure 170 may be formed by depositing a metal material layer (170L of FIG. 6C) on an upper surface of a planarized semiconductor stack 110 (for example, the first conductivity-type semiconductor layer 112L) and patterning the deposited metal material layer to form a sub-pixel space for forming wavelength conversion portions 160R, 160G, and 160B and an edge region 170E for connection to the common electrode 145.

Referring to FIG. 2, the conductive partition structure 170 may have a grid or mesh shape extending along regions between the sub-pixels SP1, SP2, and SP3 on the upper surface 110A of the semiconductor stack 110 in the X-direction and the Y-direction.

The conductive partition structure 170 may be electrically connected to the upper surface 112A of the first conductivity-type semiconductor layer 112L in a region between the LED cells LC. The conductive partition structure 170 may be provided as a single electrode structure. As an electrode structure, the conductive partition structure 170 may secure a relatively larger contact area than when the conductive partition structure 170 is formed between the LED cells LC on the lower surface of the first conductivity-type semiconductor layer 112L, so that a uniform current flow may be secured in an entire display area DA.

The conductive partition structure 170 may have a peripheral area PA disposed on one side of the display area DA in which the pixels PX are arranged, for example, an edge region 170E extending to the connection region CR. As illustrated in FIGS. 2 and 3, the conductive partition structure 170 may have a structure extending from an external sidewall of the conductive partition structure 170.

As mentioned above, the conductive partition structure 170 may directly contact the upper surface of the first conductivity-type semiconductor layer 112L, and the edge region 170E of the conductive partition structure 170 may be connected to the common electrode 145. Accordingly, the common electrode 145 may be used as a portion of the common electrode structure for an LED cell LC of each of the sub-pixels SP1, SP2, and SP3. The common electrode 145 may be disposed on at least one side of the upper surface 110A of the semiconductor stack 110 and may have at least a region exposed from the one side. Such a connection may be implemented by an interconnect portion 175 disposed on a region adjacent to the at least one side of the upper surface 110A of the semiconductor stack 110. The interconnect portion 175 may be configured to connect the edge region 170E and the exposed region of the common electrode 145 to each other. As described above, the common electrode 145 may be connected to the driving circuit of the circuit board 200 through the first upper bonding electrode 198A and the first lower bonding electrode 298A.

As illustrated in FIG. 2, the edge region 170E of the conductive partition structure 170 may extend along a plurality of (for example, two) external sidewalls of the conductive partition structure 170. In some example embodiments, the edge region 170E of the conductive partition structure 170 may extend along all external sidewalls of the conductive partition structure 170. The common electrode 145 may include a plurality of common electrodes 145 to secure uniform current supply to the conductive partition structure 170. In some example embodiments, edge regions 170E of four respective external sidewalls may be configured to be connected to one or more common electrodes 145.

A transparent insulating layer 181 may be formed on an upper surface and sidewalls of the conductive partition structure 170. The transparent insulating layer 181 may be used as a refractive index matching layer allowing light to be smoothly emitted from a portion of the semiconductor stack 110 disposed on a bottom surface of the sub-pixel space. The transparent insulating layer 181 may include a low refractive index layer. For example, the transparent insulating layer 181 may include at least one of $SiO_2$ and $MgF_2$.

In the sub-pixel space of the conductive partition structure 170 on which the transparent insulating layer 181 is formed, wavelength conversion portions 160R, 160G, and 160B for colors of the sub-pixels SP1, SP2, and SP3 may be formed. The wavelength conversion portions 160R, 160G, and 160B may be disposed to correspond to the LED cells LC. The wavelength conversion portions 160R, 160G, and 160B may include a wavelength conversion material converting a wavelength of light, emitted from the LED cells LC, to generate final light of a desired color from each of the sub-pixels SP1, SP2, and SP3. The wavelength conversion material may include a phosphor and/or quantum dots, and the wavelength conversion portions 160R, 160G, and 160B may be obtained by filling each sub-pixel space with a liquid binder resin, in which the wavelength conversion material is dispersed, and then curing the liquid binder resin.

When each of the active layer 114P of the plurality of LED cells LC is configured to emit blue light, the first wavelength conversion portion 160R may be configured to convert blue light into red light, the second wavelength conversion portion 160G may be configured to convert blue light into green light. However, the third wavelength conversion portion 160B applied to a sub-pixel space for a blue sub-pixel may be replaced with a transparent material such as a transparent resin, but example embodiments are not limited thereto. In other example embodiments, when each of the active layers 114P of the plurality of LED cells LC is configured to emit ultraviolet light, the first wavelength conversion portion 160R may be configured to convert ultraviolet light into red light, the second wavelength conversion portion 160G may be configured to convert ultraviolet light into green light, and the third wavelength conversion portion 160B may be configured to convert ultraviolet light to blue light.

A passivation layer 120 may be disposed on a lower surface of the semiconductor stack 110, for example, a portion of lower surfaces of the LED cells LC and side surface of the LED cells LC. Referring to FIG. 3, the passivation layer 120 may cover a portion of the lower surfaces of the LED cells LC and the side surfaces of the LED cells LC, and may extend to the peripheral area PA. The passivation layer 120 may extend to the peripheral area PA to be disposed to cover the lower surface of the first conductivity-type semiconductor layer 112L. The passivation layer 120 may include an insulating material, for example, at least one of SiO2, SiN, SiCN, SiOC, SiON, or SiOCN.

Contact layers 155 and second electrodes 150 may be sequentially disposed on lower surfaces of the second conductivity-type semiconductor layers 116P to be connected to the second conductivity-type semiconductor layers 116P. The contact layer 155 may be disposed to cover an entire lower surface of the second conductivity-type semiconductor layer 116P. Similarly to the conductive partition structure 170 provided as the first electrode, the second electrode 150 may include a reflective metal material. For example, the second electrode 150 may include at least one of silver (Ag), nickel (Ni), aluminum (Al), chromium (Cr), rhodium (Rh), iridium (Ir), palladium (Pd), and ruthenium (Ru), magnesium (Mg), zinc (Zn), platinum (Pt), or gold (Au). In some example embodiments, the second electrode 150 may have a single-layer or multilayer structure of a conductive material.

The contact layer 155 may include a transparent electrode layer such as ITO. In some example embodiments, the contact layers 155 may include a metal, similar to that of the second electrodes 150.

The second electrode 150, a reflective electrode, may be disposed to overlap the LED cells LC below each of the LED cells LC in a Z-direction. The second electrode 150 may be disposed below the contact layer 155 to be connected to the contact layer 155. A length of the second electrode 150 in the X-direction may be the same as or similar to a length of the LED cells LC. However, the length of the second electrode 150 in the X-direction are not limited thereto, and may vary according to example embodiments. In some example embodiments, the second electrodes 150 may be omitted. In this case, the contact layers 155 may be directly connected to the upper bonding electrodes 198 disposed therebelow.

The pixel array 100 may further include an encapsulation layer 182 and a planarization layer 184 on the wavelength conversion portions 160R, 160G, and 160B, a pad electrode 147, a wiring insulating layer 190, and an upper bonding insulating layer 195, upper bonding electrodes 198, and an external connection pad 199.

The semiconductor stack 110 such as the first conductivity-type semiconductor layer 112L may not extend in the peripheral area PA except for a portion of the connection region CR. As illustrated in FIG. 3, the common electrode 145 may have a region exposed from one side of the first conductivity-type semiconductor layer 112L, and may be disposed in the connection region CR.

As described above, the first conductivity-type semiconductor layer 112L may include a region integrated or continuous with the first conductivity-type semiconductor layer portion 112P of the LED cells LC. The first conductivity-type semiconductor layer 112L may be grown during a process of growing the LED cells LC. For example, the first conductivity-type semiconductor layer 112L may include the same material as the first conductivity-type semiconductor layer portion 112P in a region adjacent thereto.

The encapsulation layer 182 may be disposed to cover upper surfaces of the wavelength conversion portions 160R, 160G, and 160B. The encapsulation layer 182 may serve as a protective layer preventing deterioration of the wavelength conversion portions 160R, 160G, and 160B. In some example embodiments, the encapsulation layer 182 may be omitted.

Color filters 180R and 180G may be disposed on the wavelength conversion portions 160R, 160G, and 160B in the second and third sub-pixels SP2 and SP3. The color filters 180R and 180G may increase color purity of light emitted through the first wavelength conversion portion 160R and the second wavelength conversion unit 160G. In some example embodiments, a color filter may be further disposed on the third wavelength conversion portion 160B.

The planarization layer 184 may be disposed to cover upper surfaces of the color filters 180R and 180G and the encapsulation layer 182. The planarization layer 184 may be a transparent layer. Microlenses 185 may be disposed on the planarization layer 184 to respectively correspond to the wavelength conversion portions 160R, 160G, and 160B. The microlenses 185 may collect light from the wavelength conversion portions 160R, 160G, and 160B. The microlenses 185 may have, for example, a diameter greater than the width of each of the LED cells LC in the X- and Y-directions. The microlenses 185 may be formed of, for example, a transparent photoresist material or a transparent thermosetting resin.

The common electrode 145 and the pad electrode 147 may be disposed in the connection region CR and the pad regions PAD, respectively. The pad electrode 147 and the common electrode 145 may be disposed on substantially the same level as the lower surface 112B of the first conductivity-type semiconductor layer 112L. As described above, the common electrode 145 may be connected to the edge region 170E of the conductive partition structure 170 provided as the first electrode by the interconnect portion 175, and may connect the conductive partition structure 170 to the first upper bonding electrode 198A. The common electrode 145 may constitute a common electrode structure together with the conductive partition structure 170 and the interconnect portion 175. In plan view, the common electrode 145 may be disposed to have a square shape or a ring shape to surround the entire pixel PX. As described above, the common electrode 145 may be connected to the edge region 170E of the conductive partition structure 170. However, the arrangement of the common electrode 145 is not limited thereto and may vary according to example embodiments. The pad electrode 147 may be disposed below the external connection pad 199 in the pad regions PAD, and may connect the external connection pad 199 and the third upper bonding electrode 198C to each other. The common electrode 145 and the pad electrode 147 may be formed of a conductive material, for example, at least one of silver (Ag), nickel (Ni), aluminum (Al), chromium (Cr), rhodium (Rh), iridium (Ir), palladium (Pd), ruthenium (Ru), magnesium (Mg), zinc (Zn), Platinum (Pt), or gold (Au).

The external connection pad 199 may be disposed on the pad electrode 147 in the pad regions PAD. The external connection pad 199 may be disposed to be exposed upwardly in a region in which the first conductivity-type semiconductor layer 112L is removed. The external connection pad 199 may be connected to an external device, for example, an external integrated circuit (IC) for applying an electrical signal to the circuit board 200 by wire bonding or anisotropic conductive film (ACF) bonding. The external connection pad 199 may electrically connect the driving circuits of the circuit board 200 and the external device to each other. The external connection pad 199 may include a metal, for example, gold (Au), silver (Ag), nickel (Ni), or the like.

As illustrated in FIG. 3, the first to third upper bonding electrodes 198A, 198B, and 198C may connect the conductive partition structure 170, the common electrode 145, and the pad electrode 147 to the first to third lower bonding electrodes 298A, 298B, and 298C of the circuit board 200, respectively.

As illustrated in FIG. 3, among the upper bonding electrodes 198, the second upper bonding electrodes 198B connected to the second electrodes 150 may have a second thickness T2 or a second height, and the first and third upper bonding electrodes 198A and 198C connected to the common electrode 145 and the pad electrode 147 may have a third thickness T3 or a third height, greater than the second thickness T2.

The upper bonding electrodes 198 may be disposed to penetrate through the wiring insulating layer 190 and the upper bonding insulating layer 195. Each of the upper bonding electrodes 198 may have a pillar shape such as a cylinder. In some example embodiments, the upper bonding electrodes 198 may have sidewalls inclined such that a size of an upper surface is smaller than a size of a lower surface. The upper bonding electrodes 198 may include, for example, copper (Cu). The upper bonding electrodes 198 may further include a barrier metal layer, for example, a tantalum (Ta)

layer and/or a tantalum nitride (TaN) layer on an upper surface and side surfaces thereof.

The wiring insulating layer 190 may be disposed below the LED cells LC together with the upper bonding insulating layer 195. The wiring insulating layer 190 may include a silicon oxide or a silicon oxide-based insulating material, for example, tetraethyl orthosilicate (TEOS), undoped silicate glass (USG), phosphosilicate glass (PSG), borosilicate glass (BSG), borophosphosilicate glass (BPSG), fluoride silicate glass (FSG), spin on glass (SOG), tonen silazane (TOSZ), or combinations thereof.

Lower surfaces of the upper bonding insulating layer 195 may be disposed to constitute a lower surface of the pixel array 100 together with lower surfaces of the upper bonding electrodes 198. The upper bonding insulating layer 195 may form dielectric-dielectric bonding with the lower bonding insulating layer 295. The circuit board 200 and the pixel array 100 may be bonded to each other by bonding the lower bonding electrodes 298 and the upper bonding electrodes 198 to each other and bonding the lower bonding insulating layer 295 and the upper bonding insulating layer 195 to each other. The bonding of the lower bonding electrodes 298 and the upper bonding electrodes 198 may be, for example, copper-to-copper (Cu-to-Cu) bonding, and the bonding of the lower bonding insulating layer 295 and the upper bonding insulating layer 195 may be, for example, dielectric-to-dielectric bonding such as a SiCN-to-SiCN bonding. The circuit board 200 and the pixel array 100 may be bonded by hybrid bonding including Cu-to-Cu bonding and dielectric-to-dielectric bonding, and may be bonded without an additional adhesive layer.

The display apparatus 10 may be implemented as a miniaturized high-resolution display apparatus by optimizing an arrangement of the electrode structure including the first electrode 170 and bonding the circuit board 200 and the pixel array 100 to each other using hybrid bonding.

Figure 4:
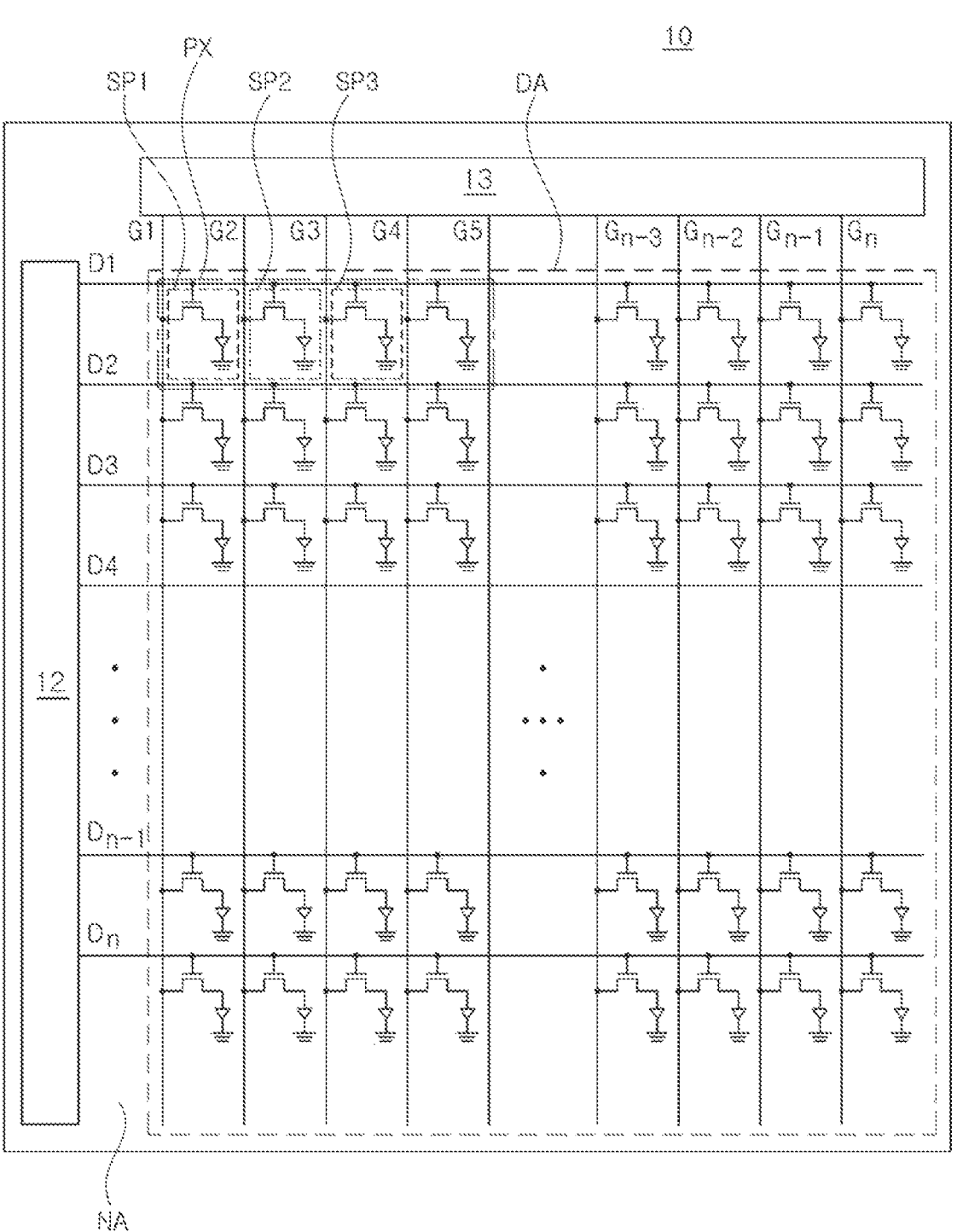
FIG. 4 is a circuit diagram of a driving circuit implemented in a display apparatus according to an example embodiment.

FIG. 4 is a circuit diagram of a driving circuit implemented in a display apparatus according to an example embodiment.

FIG. 4 is a circuit diagram of a display apparatus 10 in which N by N sub-pixels are arranged. First to third sub-pixels SP1, SP2, and SP3 may receive a data signal through data lines $D_1$ to $D_n$, paths in a gate signal, through gate lines $G_1$ to $G_n$, paths in a horizontal direction, respectively. The first to third sub-pixels SP1, SP2, and SP3 may receive a control signal, for example, a vertical direction, for example, a column direction, for example, a row direction.

A plurality of pixels PX including the first to third sub-pixels SP1, SP2, and SP3 may provide a display area DA, and the display area DA may be an active area and may be provided as a display area for a user. A non-active area NA (or a peripheral area PA) may be formed along one or more edges of the display area DA. The non-active area NA may extend along an external periphery of a panel of the display apparatus 10.

First and second driver circuits 12 and 13 may be employed to control operations of the pixels PX, for example, the first to third sub-pixels SP1, SP2, and SP3. Some or all of the first and second driver circuits 12 and 13 may be implemented on a circuit board 200. The first and second driver circuits 12 and 13 may be formed from an integrated circuit, a thin-film transistor panel circuit, or other appropriate circuitry, and may be disposed in the non-active area NA of the display apparatus 10. The first and second driver circuits 12 and 13 may include a microprocessor, a memory such as a storage, processing circuitry, and communications circuitry.

To display an image formed by the pixels PX, the first driver circuit 12 may transmit a clock signal and other control signals to the second driver circuit 13, a gate driver circuit, while providing image data to the data lines $D_1$ to $D_n$. The second driver circuit 13 may be implemented using an integrated circuit and/or a thin-film transistor circuit. A gate signal for controlling the first to third sub-pixels SP1, SP2, and SP3 arranged in the row direction may be transmitted through the gate lines $G_1$ to $G_n$ of the display apparatus 10.

FIGS. 5A to 5G are cross-sectional views illustrating processes (bonding of a circuit board and a substrate for a pixel array) in a method of manufacturing a display apparatus according to an example embodiment, and may be understood to be views illustrating a method of manufacturing the display apparatus of FIG. 3.

Figure 5A:
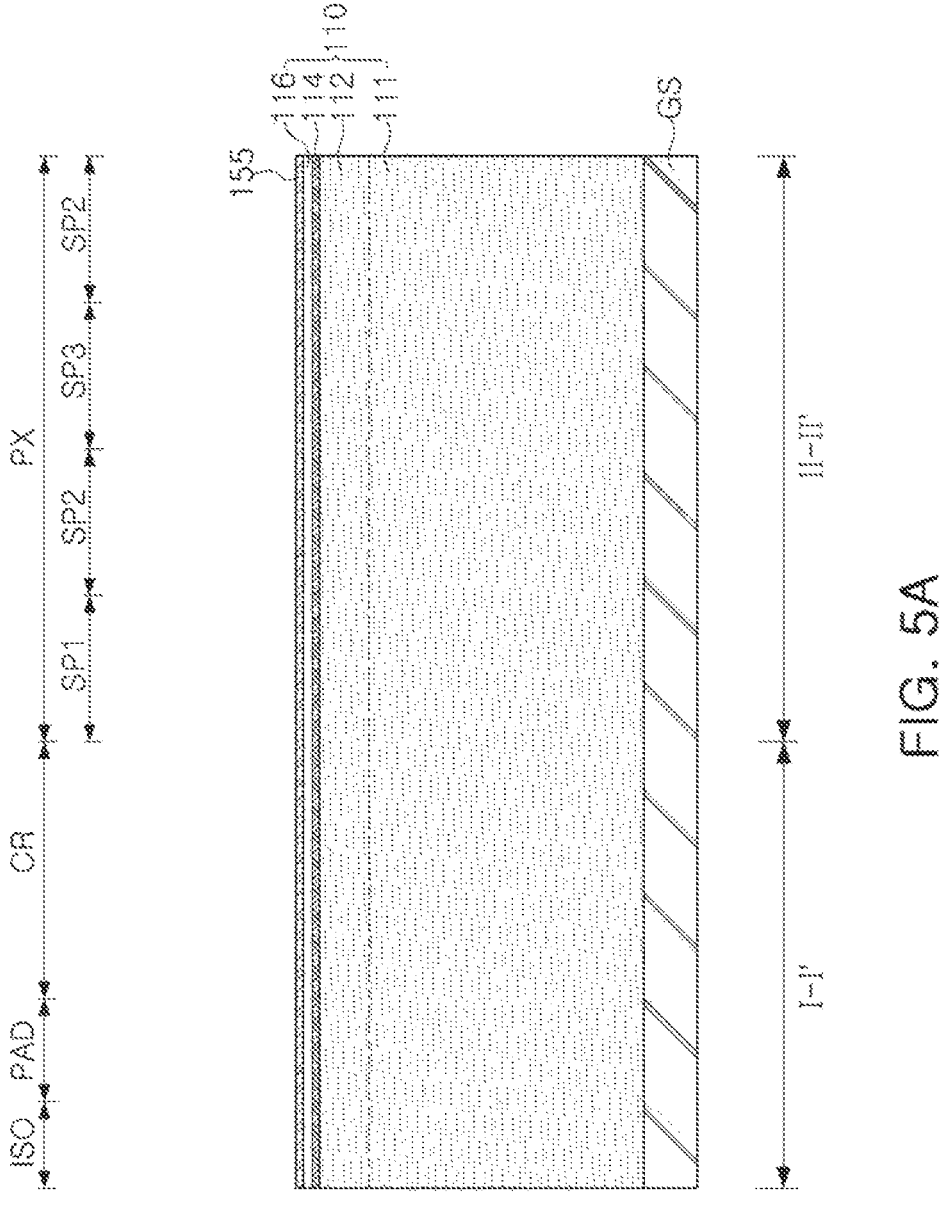
FIGS. 5A, 5B, 5C, 5D, 5E, 5F and 5G are cross-sectional views illustrating a method of manufacturing a display apparatus according to an example embodiment.

Referring to FIG. 5A, a base semiconductor layer 111, a first conductivity-type semiconductor material layer 112, an active material layer 114, and a second conductivity-type semiconductor material layer 116 may be sequentially formed on a growth substrate GS, and a contact layer 155 may be formed on the second conductivity-type semiconductor material layer 116.

The growth substrate GS may be provided to grow a nitride single crystal and may include at least one of, for example, sapphire, Si, SiC, MgAl$_2$O$_4$, MgO, LiAlO$_2$, LiGaO$_2$, or GaN. In some example embodiments, the growth substrate GS may have an uneven structure on at least a portion of an upper surface thereof to improve crystallinity and light extraction efficiency of semiconductor layers. In this case, unevenness may be formed on layers grown thereon by an additional process (see FIG. 9).

A base semiconductor layer 111, a first conductivity-type semiconductor material layer 112, an active material layer 114, and a second conductivity-type semiconductor material layer 116 may be sequentially grown on the growth substrate GS. Such a nitride single crystal may be formed using, for example, a metal organic chemical vapor deposition (MOCVD) process, a hydrogen vapor phase epitaxy (HVPE) process, or a molecular beam epitaxy (MBE) process. The first conductivity-type semiconductor material layer 112 may be an N-type nitride semiconductor layer such as N-type GaN, and the second conductivity-type semiconductor material layer 116 may be a P-type nitride semiconductor layer such as P-type GaN/P-type AlGaN. The active material layer 114 may have a multiple quantum well structure such as InGaN/GaN. In some example embodiments, the base semiconductor layer 111 may include a buffer layer and an undoped nitride layer (for example, GaN). In this case, the buffer layer may be provided to alleviate lattice defects of the first conductivity-type semiconductor material layer 112 and may include an undoped nitride semiconductor such as undoped GaN, undoped AlN, or undoped InGaN.

The contact layer 155 may be formed on an upper surface of the second conductivity-type semiconductor material layer 116. For example, the contact layer 155 may be a highly reflective ohmic contact layer or a transparent electrode layer.

Figure 5B:
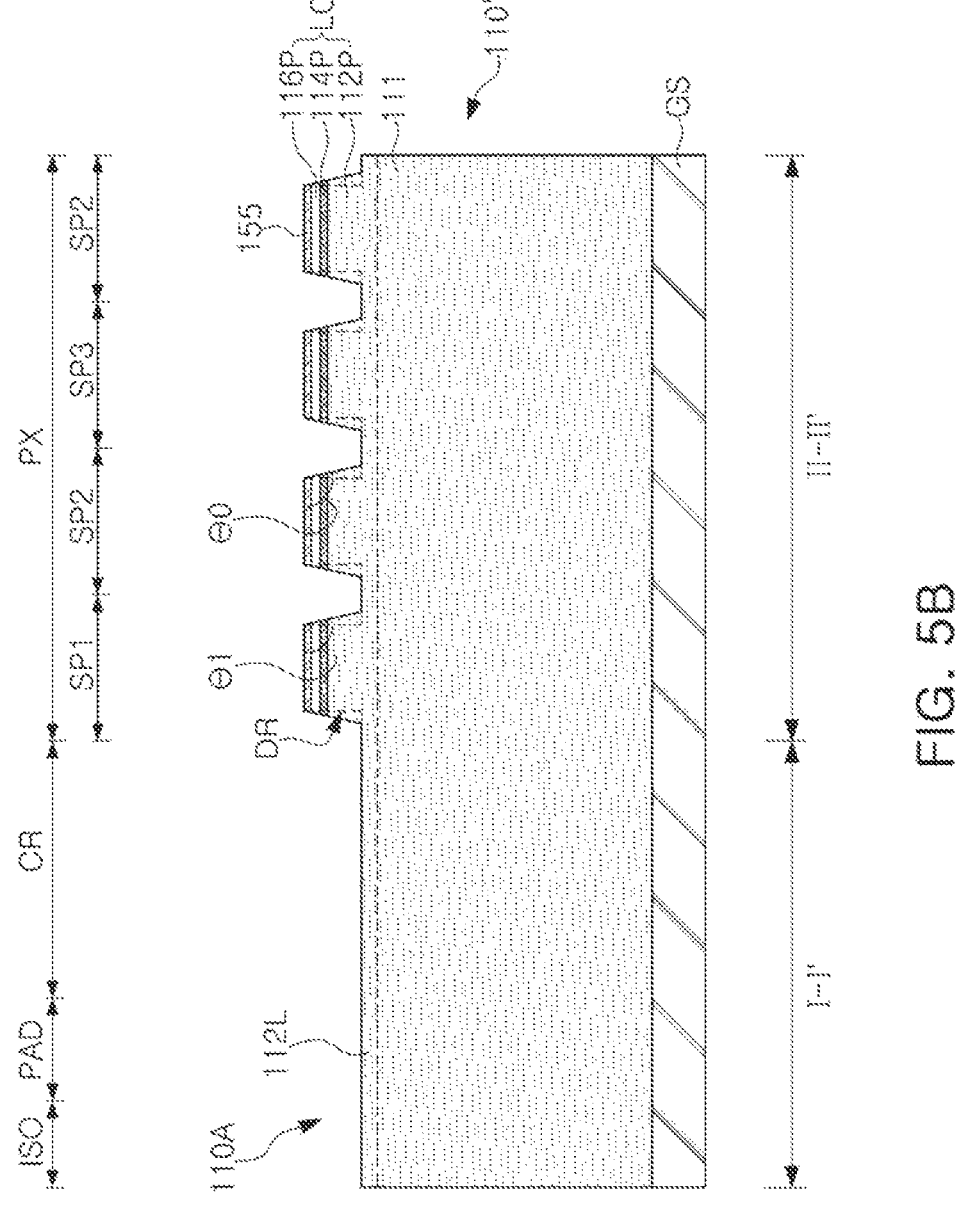

Referring to FIG. 5B, a stack structure of the first conductivity-type semiconductor material layer 112, the active material layer 114, the second conductivity-type semiconductor material layer 116, and the contact layer 155 may be etched to form LED cells LC.

In the present operation, a semiconductor stack 110" may be partially removed by a dry etching process to be separated in units of first to third sub-pixels SP1, SP2, and SP3 (see FIG. 3), for example, LED cells LC. Each of the LED cells LC may include a first conductivity-type semiconductor layer portion 112P, an active layer 114P, and a second conductivity-type semiconductor layer 116P divided by an etching process. A contact layer 155 may be disposed on upper surfaces of the LED cells LC. An unetched portion 112L of the first conductivity-type semiconductor material layer may remain as a single layer. LED cells LC may be arranged on the remaining portion 112L of the first conductivity-type semiconductor material layer. Each of the LED cells LC, obtained in the present operation, may be etched to have an inclined side surface. In addition, a portion of damaged regions DR may be formed on the side surfaces of the LED cells LC by the dry etching process.

Figure 5C:
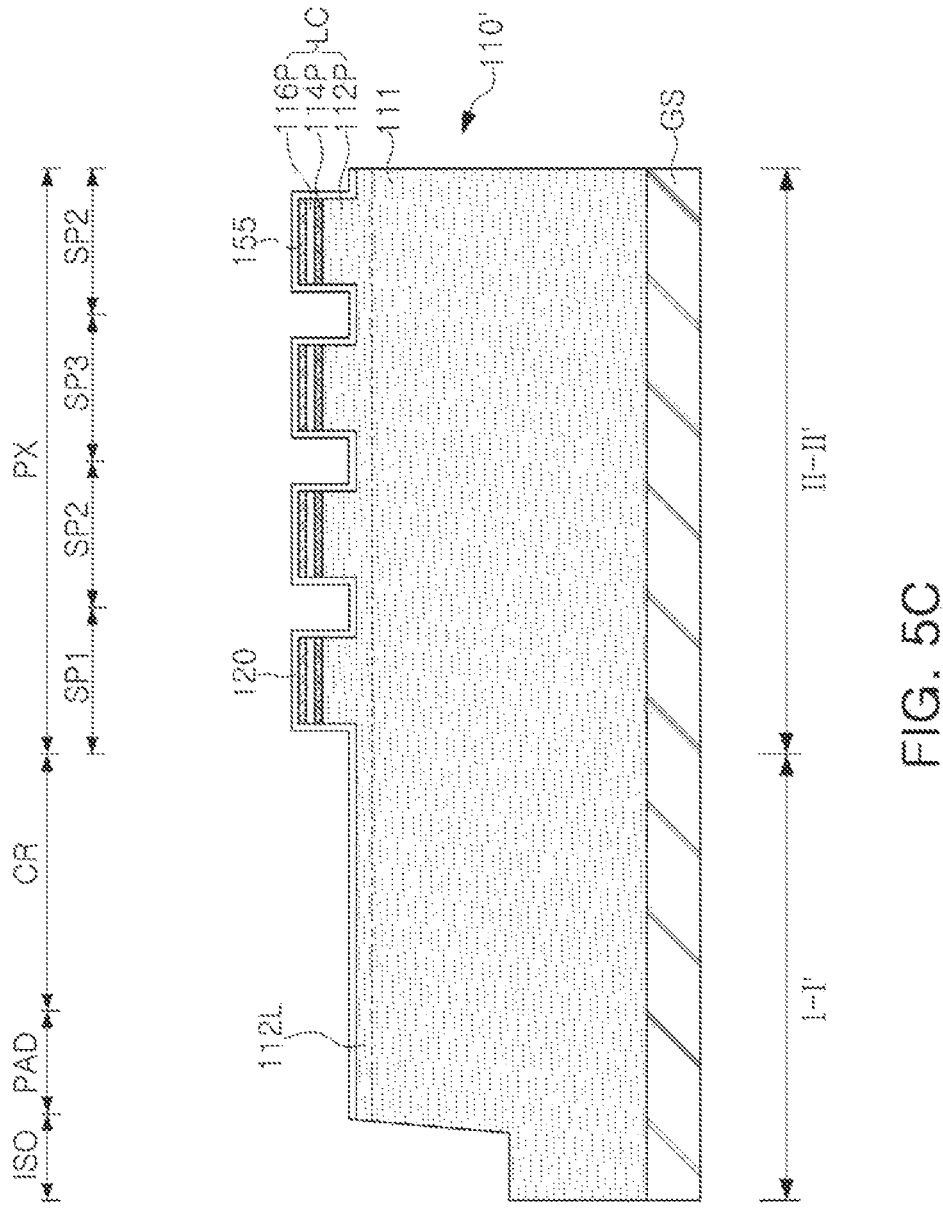

Referring to FIG. 5C, the damaged regions DR may be removed from the LED cells LC, and a passivation layer 120 may be formed on the LED cells LC.

The damaged regions DR may be selectively removed by, for example, a wet etching process. In the wet etching process, only the damaged regions DR may be selectively removed by controlling process conditions to change selectivity between crystal planes. Accordingly, an angle between the upper surface and the side surfaces of the LED cells LC may be a right angle or an angle close to a right angle, and non-radiative recombination caused by the damaged regions DR may be reduced to improve luminance.

The passivation layer 120 may be formed on an upper surface of the stack structure to have a uniform thickness, and may then be removed in regions in which the pad electrode 147 and the common electrode 145 (see FIG. 3) are to be formed. The passivation layer 120 may include at least one of, for example, $SiO_2$, SiN, SiCN, SiOC, SiON, and SiOCN. The passivation layer 120 may be conformally formed, and thus may have a substantially uniform thickness.

In some example embodiments, a portion constituting the base semiconductor layer 111 and the first conductivity-type semiconductor layer 112L may be removed to a predetermined depth in an edge region ISO. The edge region ISO is a region cut in a subsequent process, and may be a region for separating modules. Accordingly, in the present operation, a semiconductor stack 110' may be partially removed to prevent cracking from occurring in the cutting process or a dicing process. A portion of the first conductivity-type semiconductor layer 112L may be removed to a predetermined depth in an entire region of the semiconductor stack 110' to expose a pad electrode 147 and a common electrode 145 (see FIGS. 6A and 6B), so that a process of etching a portion of the edge region ISO may be omitted.

Figure 5D:
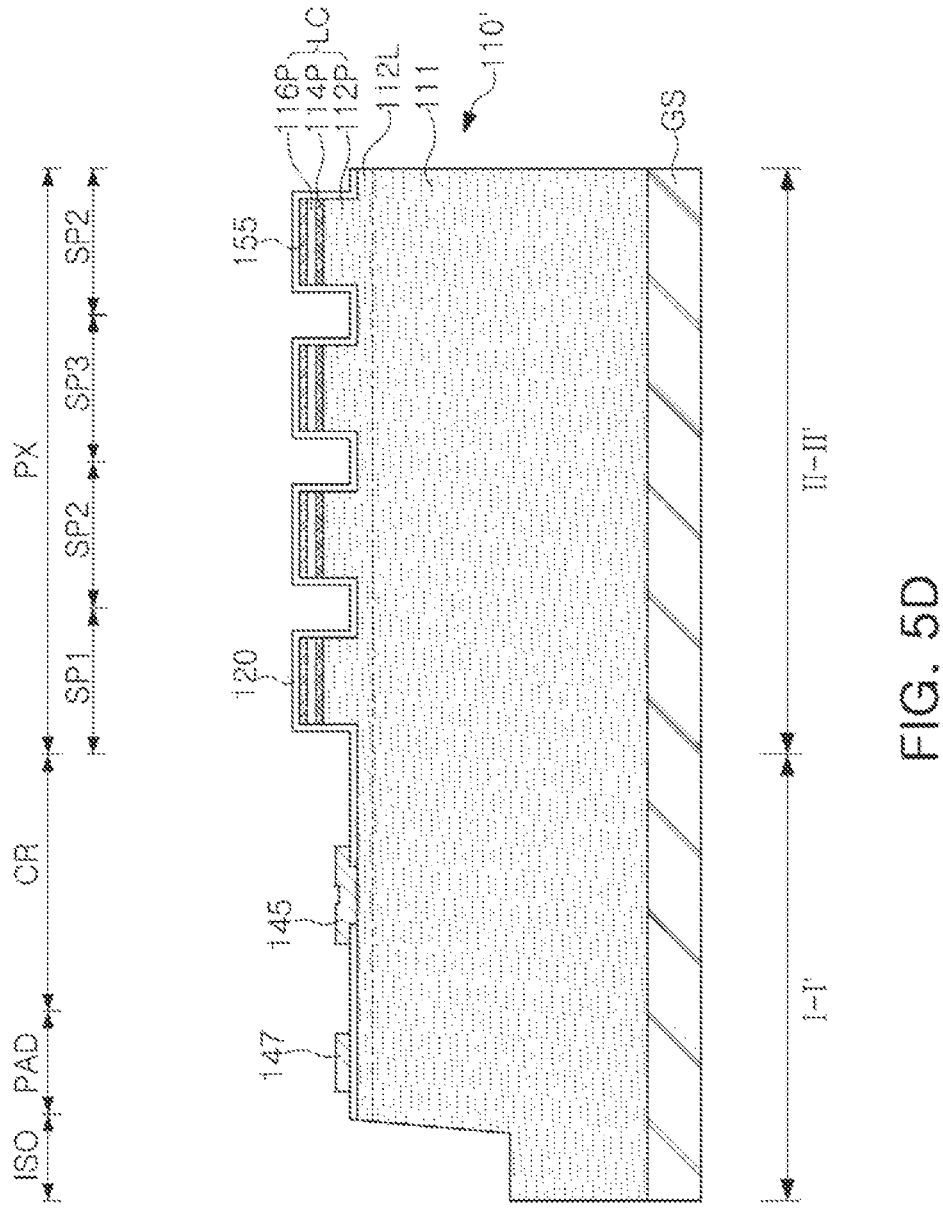

Referring to FIG. 5D, a common electrode 145 and a pad electrode 147 may be formed.

The common electrode 145 and the pad electrode 147 may be formed in the connection region CR and the pad regions PAD of FIG. 3, respectively. The common electrode 145 and the pad electrode 147 may be formed on the passivation layer 120. The common electrode 145 and the pad electrode 147 may be formed together through the same process. In some example embodiments, at least one of the common electrode 145 and the pad electrode 147 may be formed in an opening in the passivation layer 120 after the opening is formed. The common electrode 145 and the pad electrode 147 may include a conductive material, for example, a metal.

Figure 5E:
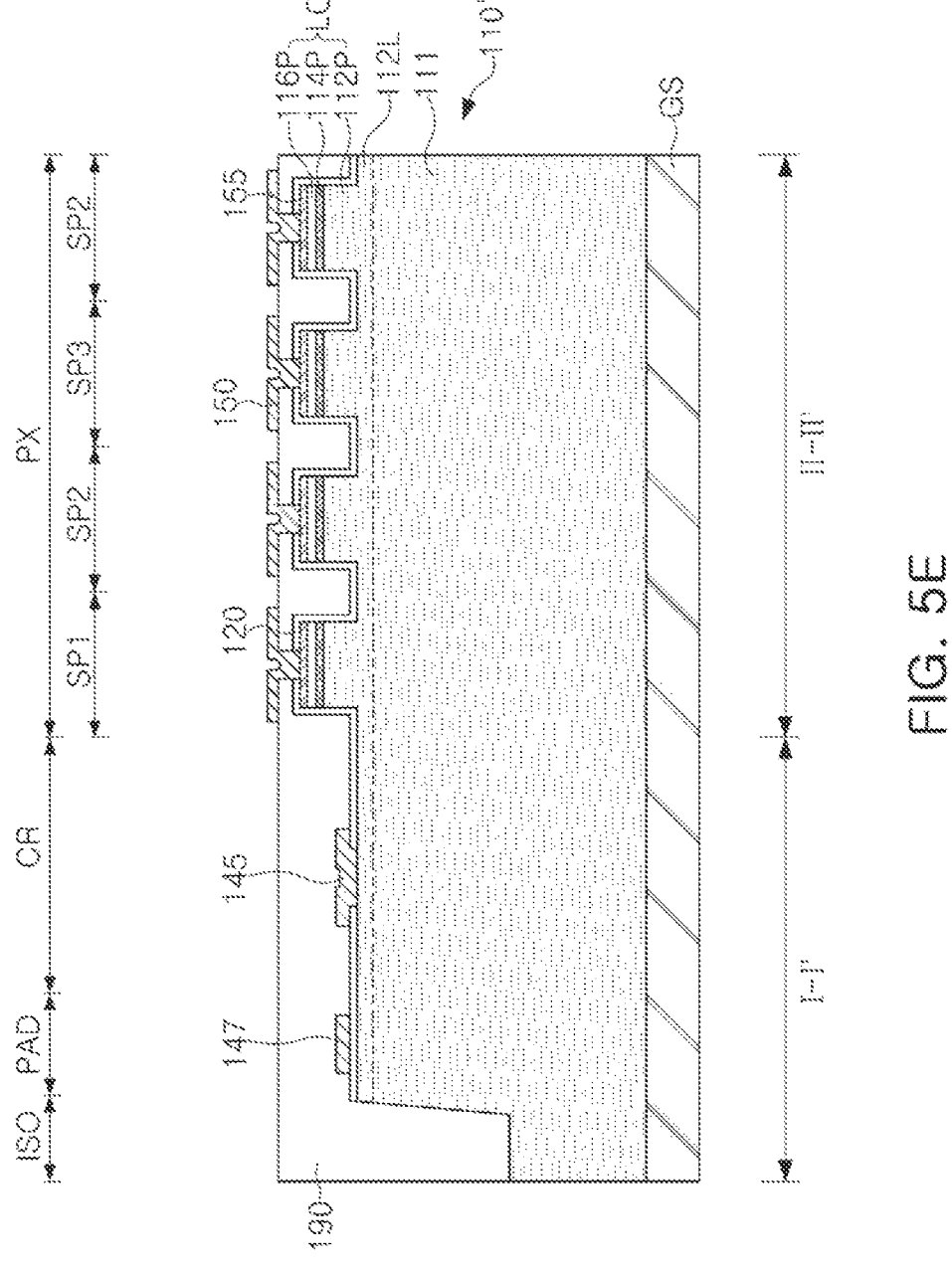

Referring to FIG. 5E, a wiring insulating layer 190 may be formed on the semiconductor stack 110' to cover the LED cells LC. Second electrodes 150 may be formed to be connected to the contact layers 155.

A desired wiring insulating layer 190 may be formed by forming a preliminary wiring insulating layer on the semiconductor stack 110', removing a portion of the preliminary wiring insulating layer to a desired thickness, and planarizing the preliminary wiring insulating layer. A portion of the preliminary wiring insulating layer may be removed using a planarization process, such as a chemical mechanical polishing (CMP) process or an etch-back process, to form a wiring insulating layer 190 having a planar upper surface. The preliminary wiring insulating layer for forming the wiring insulating layer 190 may include a low-K dielectric material such as a silicon oxide.

Contact holes may be formed through the wiring insulating layer 190 and the passivation layer 120 to expose the contact layers 155. By filling the contact holes with a conductive material, the second electrodes 150 may be formed to fill the contact holes and to extend to an upper surface of the wiring insulating layer 190. The second electrodes may include a reflective metal material.

Figure 5F:
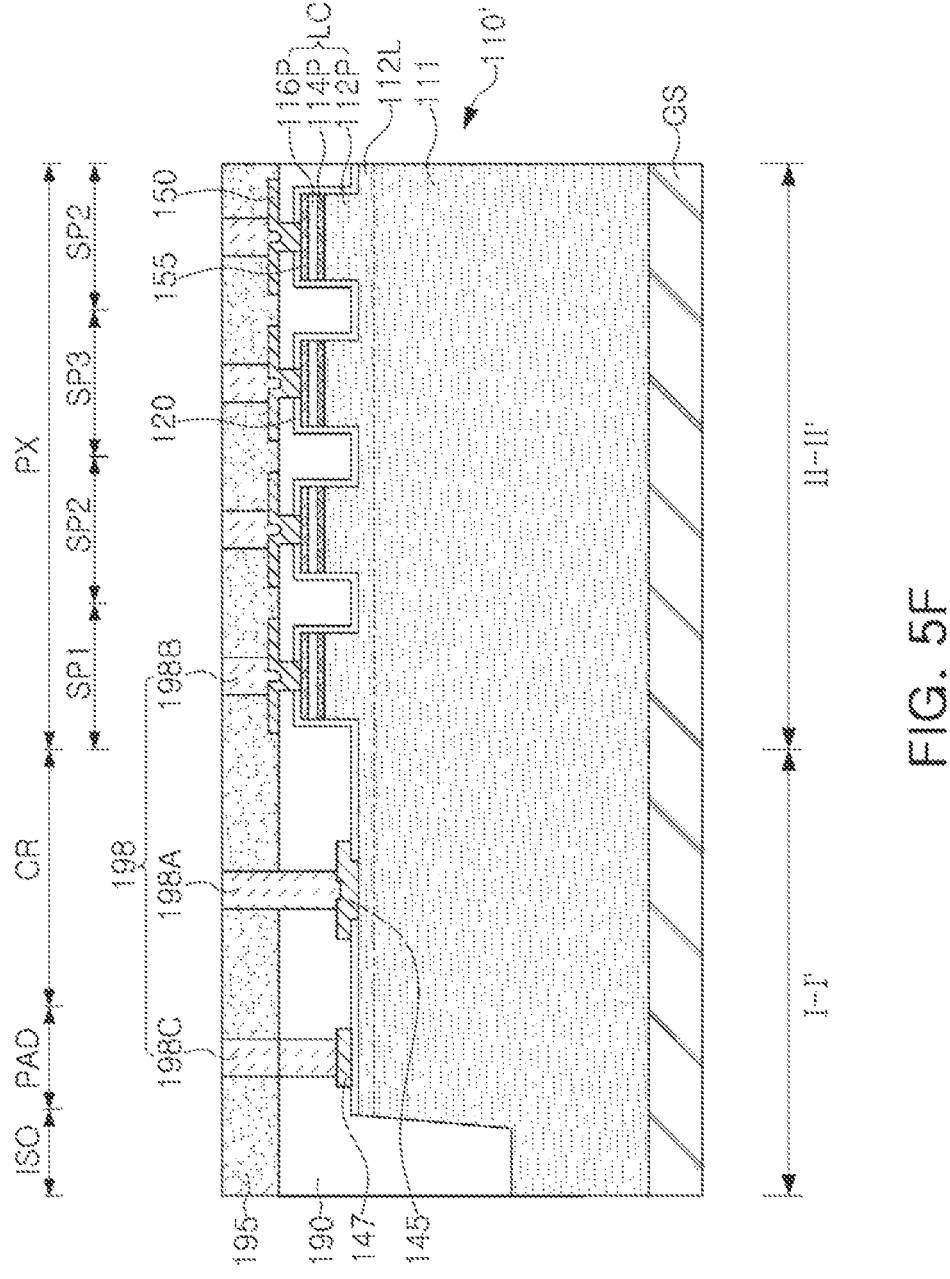

Referring to FIG. 5F, an upper bonding insulating layer 195 may be formed on the second electrodes 150, and upper bonding electrodes 198 may be formed.

The upper bonding insulating layer 195 may include a material the same as or different from a material of the wiring insulating layer 190. Even when the upper bonding insulating layer 195 includes a material, different from a material of the wiring insulating layer 190, a thickness of the upper bonding insulating layer 195 may vary within a range, in which the upper bonding insulating layer 195 constitute an upper surface of the pixel array 100 (see FIG. 3), in example embodiments.

The upper bonding electrodes 198 may be formed by forming via holes to penetrate through the upper bonding insulating layer 195 and the wiring insulating layer 190 and then filling the via holes with a conductive material. The upper bonding electrodes 198 may be formed to be connected to the common electrode 145, the second electrodes 150, and the pad electrode 147. For example, the upper bonding electrodes 198 may include a first upper bonding electrode 198A connected to the common electrode 145, second upper bonding electrodes 198B, respectively connected to the second electrodes 150, and a third upper bonding electrode 198C connected to the pad electrode 147.

Figure 5G:
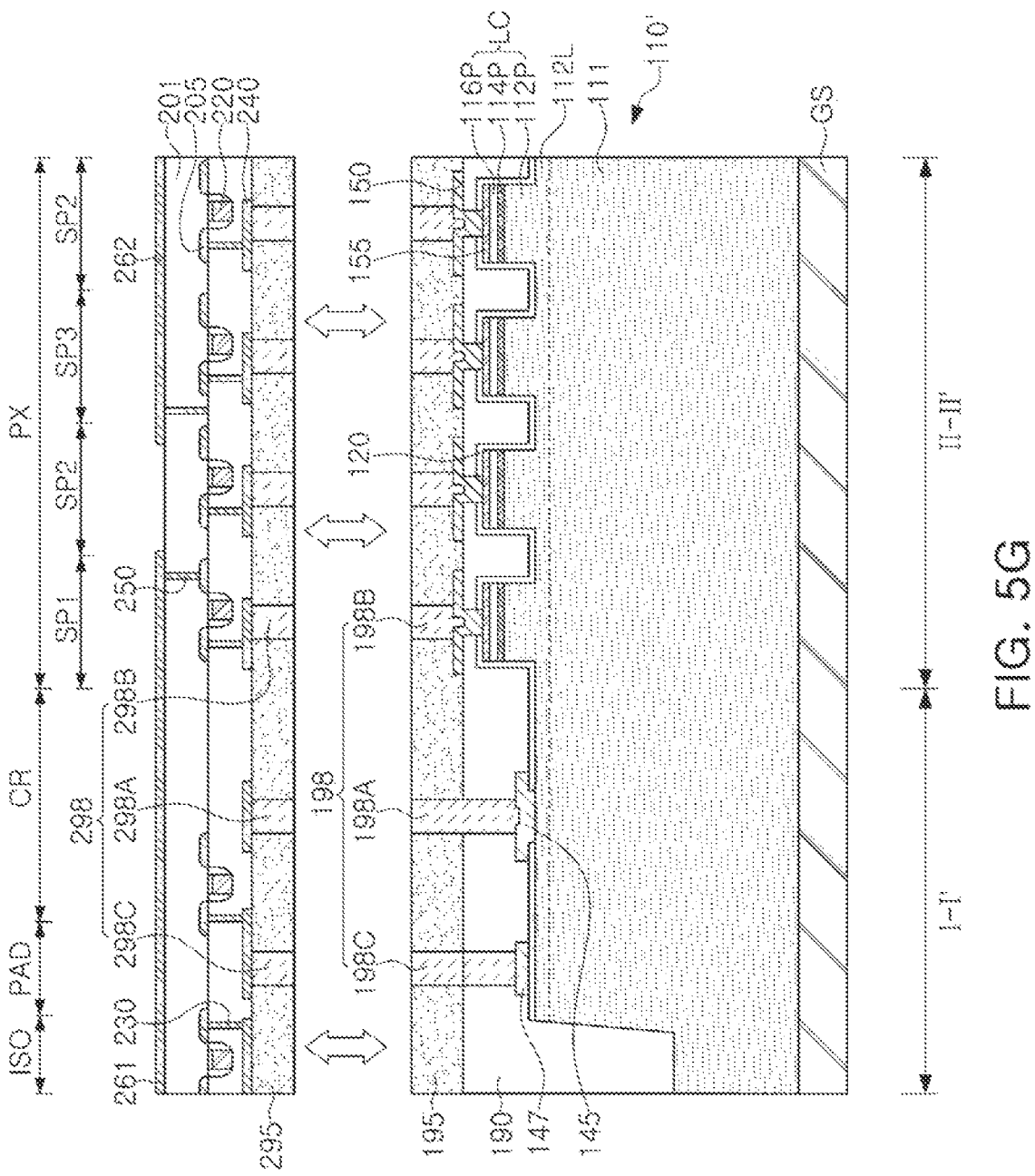

Referring to FIG. 5G, the pixel array 100 including the LED cells LC and the circuit board 200 may be bonded to each other.

A circuit board 200 may be prepared through an additional process. The pixel array 100 and the circuit board 200 may be individually manufactured, and may be bonded to each other on a wafer level by a wafer bonding method, for example, the above-mentioned hybrid bonding method. Similar to the pixel array 100, the circuit board 200 may include a lower bonding insulating layer 295 and lower bonding electrodes 298 penetrating through the lower bonding insulating layer 295 to be electrically connected to a driving circuit.

The lower bonding insulating layer 295 may form dielectric-to-dielectric bonding with the upper bonding insulating layer 195. The bonding of the lower bonding insulating layer 295 and the upper bonding insulating layer 195 may be, for example, dielectric-to-dielectric bonding such as SiCN-to-SiCN bonding.

The lower bonding electrodes 298 may include a first lower bonding electrode 298A bonded to the first upper bonding electrode 198A, a second lower bonding electrode 298B bonded to the second upper bonding electrodes 198B, and a third lower bonding electrode 298C bonded to the third upper bonding electrode 198C. The bonding of the lower bonding electrodes 298 and the upper bonding electrodes 198 may be, for example, copper-to-copper (Cu-to-Cu) bonding.

The circuit board 200 and the pixel array 100 may be bonded to each other by hybrid bonding including Cu-to-Cu bonding and dielectric-to-dielectric bonding, and may be bonded to each other without an additional adhesive layer.

FIGS. 6A to 6E are cross-sectional views for illustrating formation of a pixel array in a method of manufacturing a display apparatus according to an example embodiment. For example, the processes may be understood to be processes subsequent to the process of FIG. 5G.

Figure 6A:
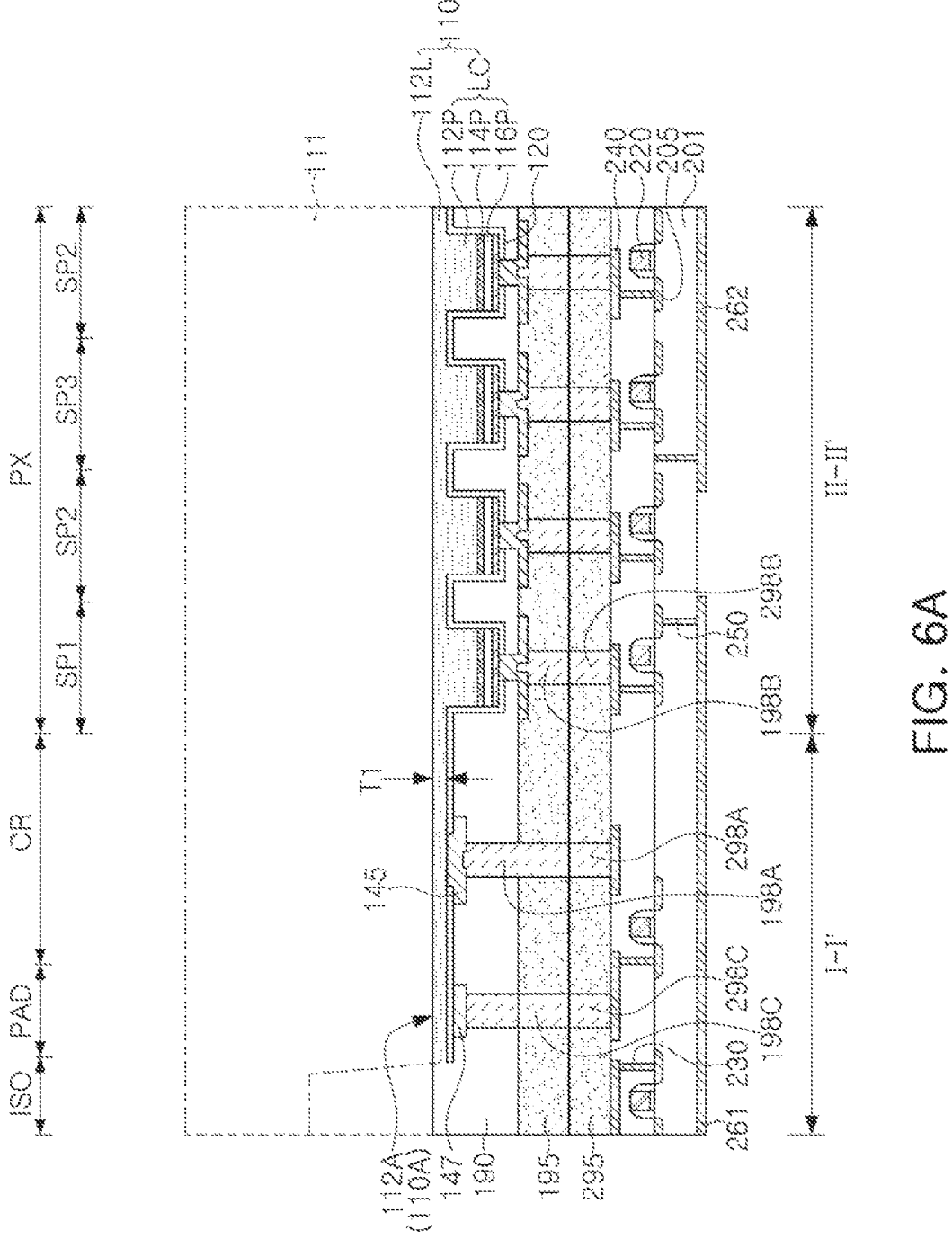
FIGS. 6A, 6B, 6C, 6D and 6E are cross-sectional views for each main process, illustrating a method of manufacturing a display apparatus according to an example embodiment.

Referring to FIG. 6A, the growth substrate GS may be removed, and the base semiconductor layer 111 may then be removed to form a planarized surface 112A of the first conductivity-type semiconductor layer 112L.

The growth substrate GS may be removed by various processes such as laser lift-off, mechanical polishing or chemical mechanical polishing (CMP), or etching.

In addition, the base semiconductor layer 111 may be removed using a polishing process such as CMP to expose the surface 112A of the first conductivity-type semiconductor layer 112L. As described above, the exposed surface 110A of the semiconductor stack 110 is provided by the first conductivity-type semiconductor layer 112L in the present process. Therefore, the exposed surface 110A of the semiconductor stack 110 may be used as a contact region for a first electrode structure. The exposed surface 112A of the first conductivity-type semiconductor layer 112L may have a surface planarized by a polishing process. In the present process, a thickness of the first conductivity-type semiconductor layer 112L may be controlled to be a desired thickness T1. The thickness T1 of the first conductivity-type semiconductor layer 112L may be, for example, about 0.1 µm or more. In some example embodiments, the thickness T1 of the first conductivity-type semiconductor layer 112L may be within a range of about 0.1 µm to about 2.0 µm, in detail, a range of about 0.1 µm to about 1.0 µm.

Figure 6B:
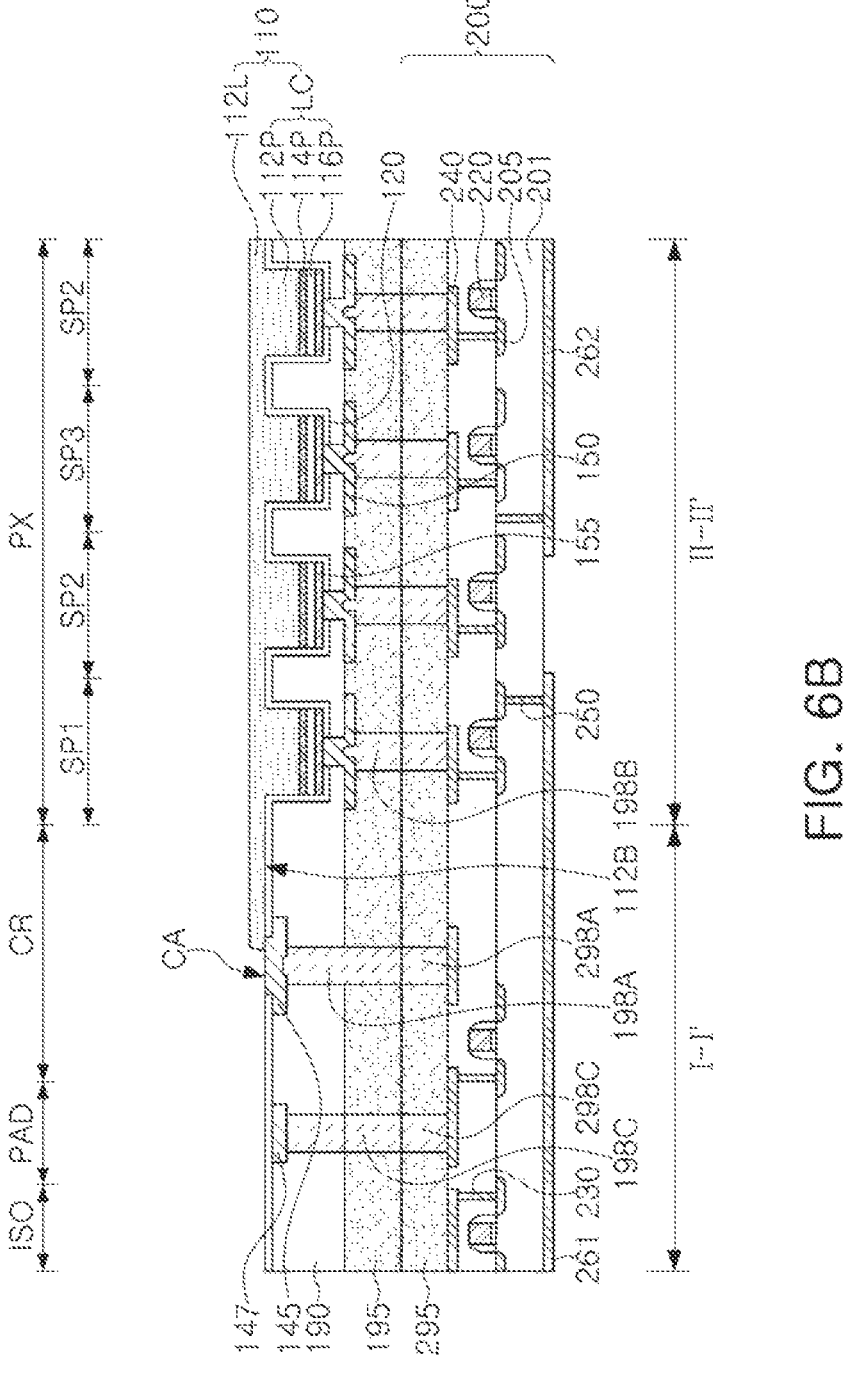

Referring to FIG. 6B, a partial area of the first conductivity-type semiconductor layer 112L may be removed on one side of the semiconductor stack 110 to expose at least a partial area CA of the common electrode 145.

In the present process, the partial area of the first conductivity-type semiconductor layer 112L may be removed to secure a contact area CA of a common electrode 145. The contact area CA of the common electrode 145 may be disposed to be adjacent to one side of the first conductivity-type semiconductor layer 112L. In the present process, a portion of the first conductivity-type semiconductor layer 112L disposed on the pad electrode 147 may also be removed to expose the passivation layer 120 or the wiring insulating layer 190.

Figure 6C:
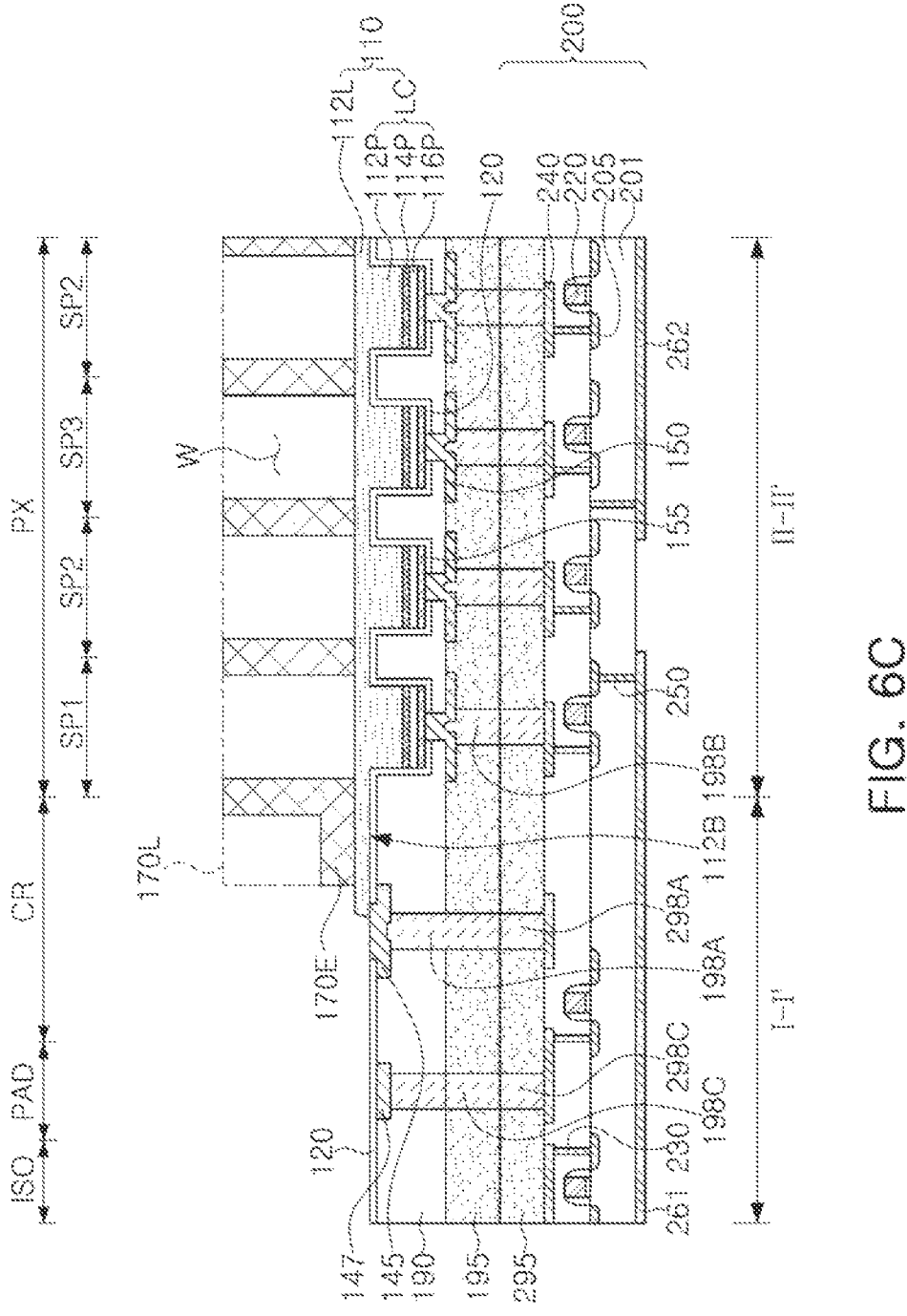

Referring to FIG. 6C, an electrode material layer 170L may be deposited on the semiconductor stack 110, and may then be etched in a desired pattern to form a conductive partition structure 170.

In the present process, an electrode material layer 170L may be deposited on the semiconductor stack 110 to have a predetermined thickness. The electrode material layer 170L may correspond to a partition structure having a desired height. The electrode material layer 170L may be selectively etched using a photoresist process to form a conductive partition structure.

The selective etching process may be performed such that the conductive partition structure 170 has a window W in a region corresponding to the LED cells LC. Each window W may provide first to third sub-pixels (SP1, SP2, and SP3 of FIG. 3) to corresponding first to third sub-pixel spaces. The first to third sub-pixel spaces may provide a space for forming the wavelength conversion portions 160R, 160G, and 160B of FIG. 3.

The conductive partition structure 170 may include an electrode material and may be formed on the semiconductor stack 110 to directly contact the first conductivity-type semiconductor layer 112L. Therefore, the conductive partition structure 170 may be used as a first electrode of a first electrode structure. The first electrode may have a grid structure and may be employed as a portion of a common electrode structure associated with all LED cells.

The conductive partition structure 170, formed in the present process, may include an edge region 170E extending toward the common electrode 145 from an external sidewall thereof. The edge region 170E may be provided on the entire external sidewall to surround the conductive partition structure 170 (see FIG. 2).

Figure 6D:
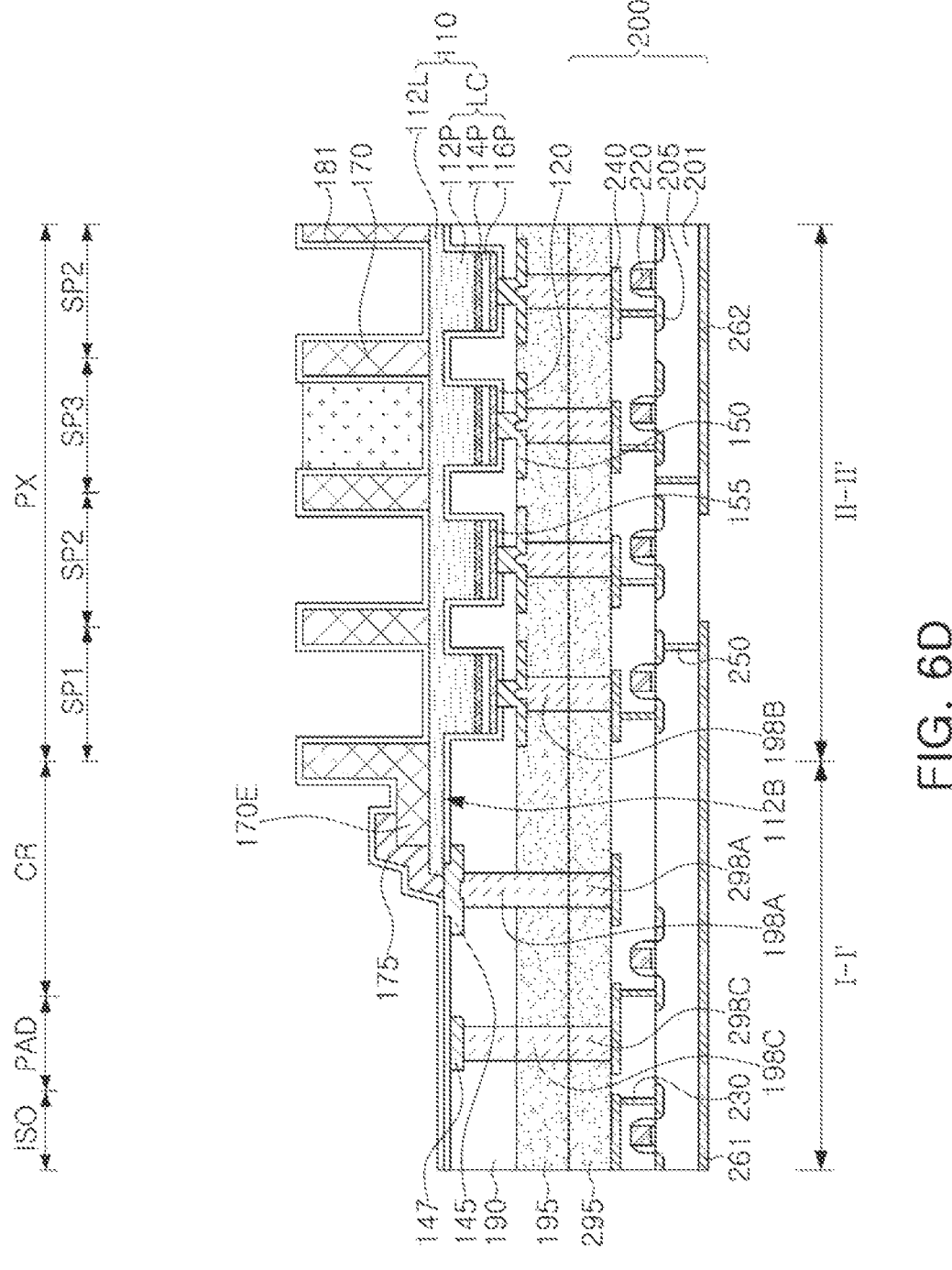

Referring to FIG. 6D, the edge region 170E of the conductive partition structure 170 and the exposed contact area CA of the common electrode 145 may be connected to each other by an interconnect portion 175, and a transparent insulating layer 181 may be formed on a surface of the conductive partition structure 170 and a bottom surface of a sub-pixel space.

In the present process, the interconnect portion 175 may be formed to connect an edge region 170E of the conductive partition structure 170, directly contacting the first conductivity-type semiconductor layer 112L, to the common electrode 145. Accordingly, the conductive partition structure 170, the interconnect portion 175, and the common electrode 145 may provide a common electrode structure for a first electrode structure of an LED cell LC of each of the sub-pixels SP1, SP2, and SP3.

A transparent insulating layer 181 may be formed on an upper surface and sidewalls of the conductive partition structure 170. The transparent insulating layer 181 may be used as a refractive index matching layer allowing light to be smoothly emitted from a portion of the semiconductor stack 110 disposed on a bottom surface of the sub-pixel space. For example, the transparent insulating layer 181 may include at least one of $SiO_2$ and $MgF_2$.

Figure 6E:
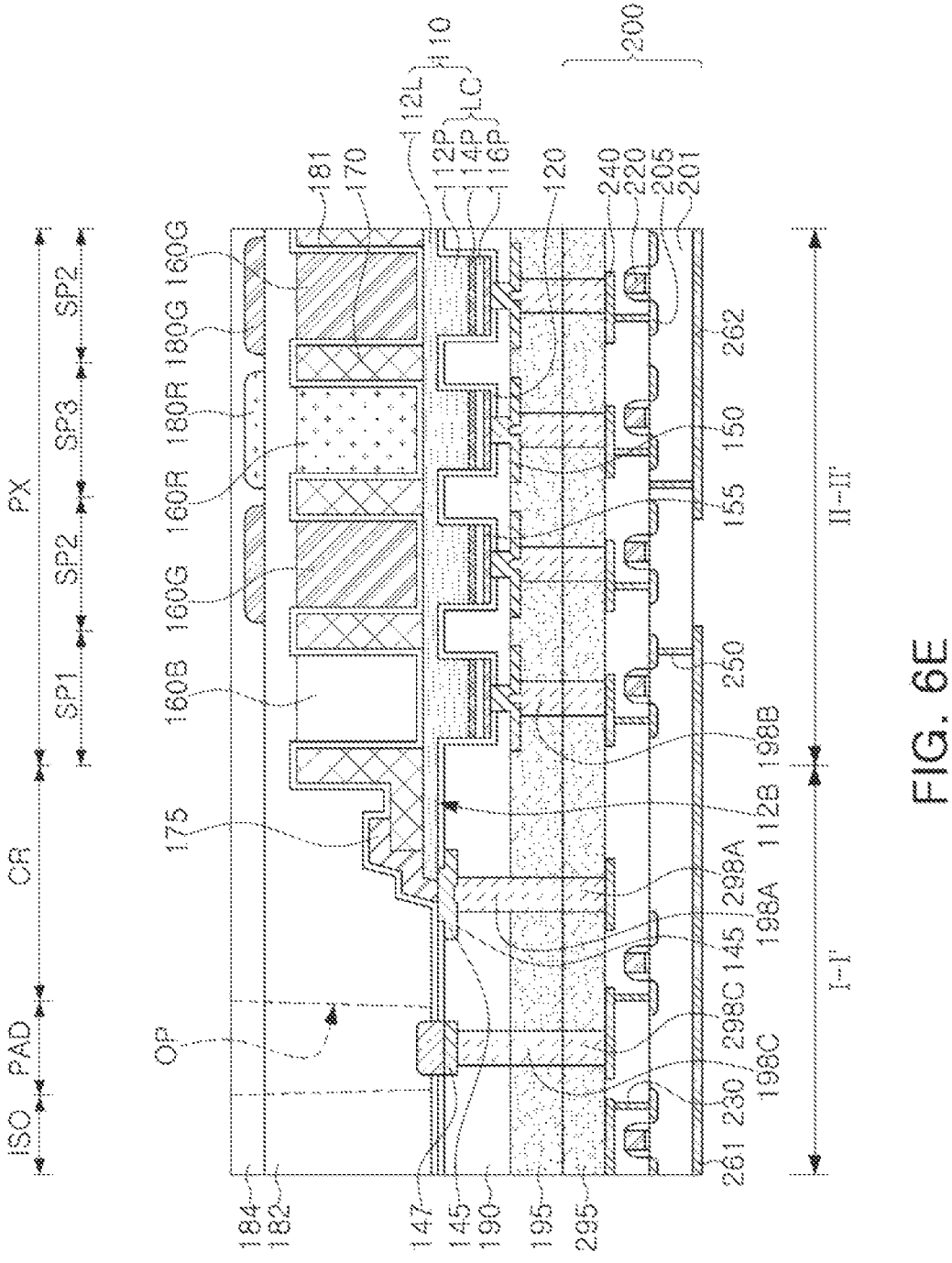

Referring to FIG. 6E, wavelength conversion portions 160R, 160G, and 160B may be formed in the sub-pixel space W, and color filters 180R and 180G and microlenses 185 may be formed on the wavelength conversion portions 160R, 160G, and 160B.

The first and second wavelength conversion portions 160R and 160G may be formed by forming a transparent resin, in which a wavelength conversion material is mixed, in the first and second sub-pixel spaces. The wavelength conversion material may convert blue light, emitted from the LED cells LC, into red light and green light in the first and second wavelength conversion portions 160R and 160G, respectively. In addition, a third wavelength conversion portion 160B (e.g., a transparent portion) formed of a transparent resin may be formed in the third sub-pixel space. The transparent resin used in the present process may include, for example, a transparent resin such as a silicone resin or an epoxy resin. In some example embodiments, the wavelength conversion portions 160R, 160G, and 160B may use a silicon oxide such as $SiO_2$, rather than a transparent resin.

Then, an encapsulation layer 182 may be formed on the wavelength conversion portions 160R, 160G, and 160B to protect the wavelength conversion portions 160R, 160G, and 160B from moisture, oxygen, or the like. The color filters 180R and 180G may be formed on the first and second wavelength conversion portions 160R and 160G, respectively. According to example embodiments, the color filters 180R and 180G may also be formed on the third wavelength conversion portion 160B.

A planarization layer 184 may be formed to cover the color filters 180R and 180G, and microlenses 185 may be formed. Then, an opening OP may be formed to penetrate through the encapsulation layer 182 and the planarization layer 184 on the pad electrode 147. The opening OP may be formed to expose a portion of the passivation layer 120 (or the transparent insulating layer 181) on the pad electrode 147 in the pad regions PAD. After removing a portion of the passivation layer 120 (and the transparent insulating layer 181) exposed through the opening OP, an external connection pad 199 may be formed and adjacent modules may be diced in the edge region ISO to finally manufacture the display apparatus 10 (see FIG. 3).

Figure 7:
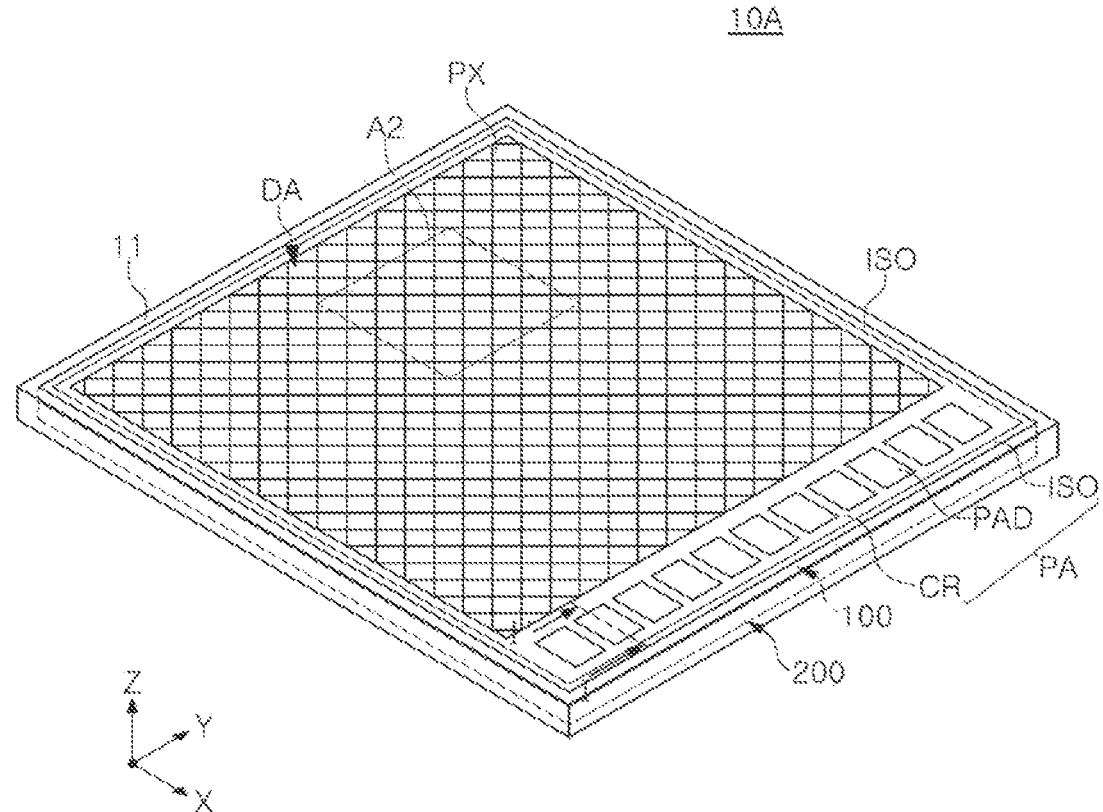
FIG. 7 is a schematic perspective view of a display apparatus according to an example embodiment.
Figure 8:
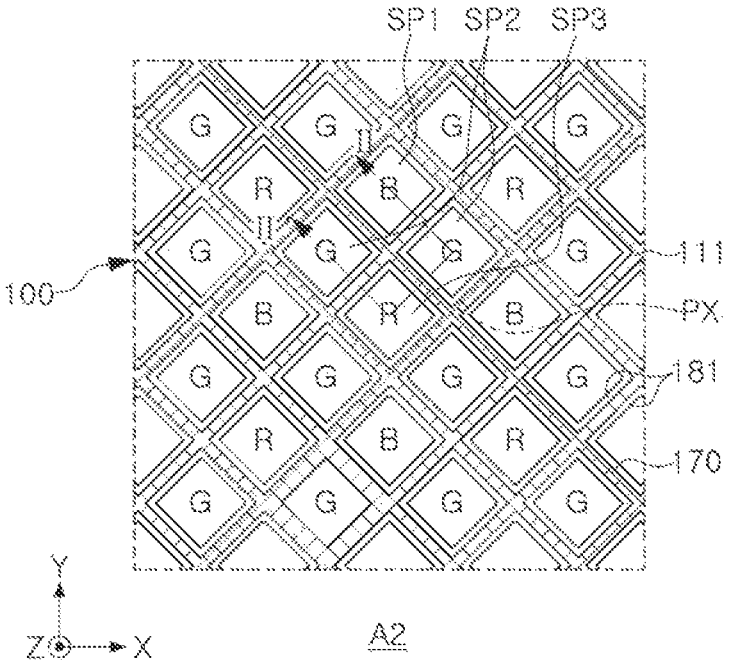
FIG. 8 is a partially enlarged plan view of portion "A2" of a display apparatus according to an example embodiment.
Figure 9:
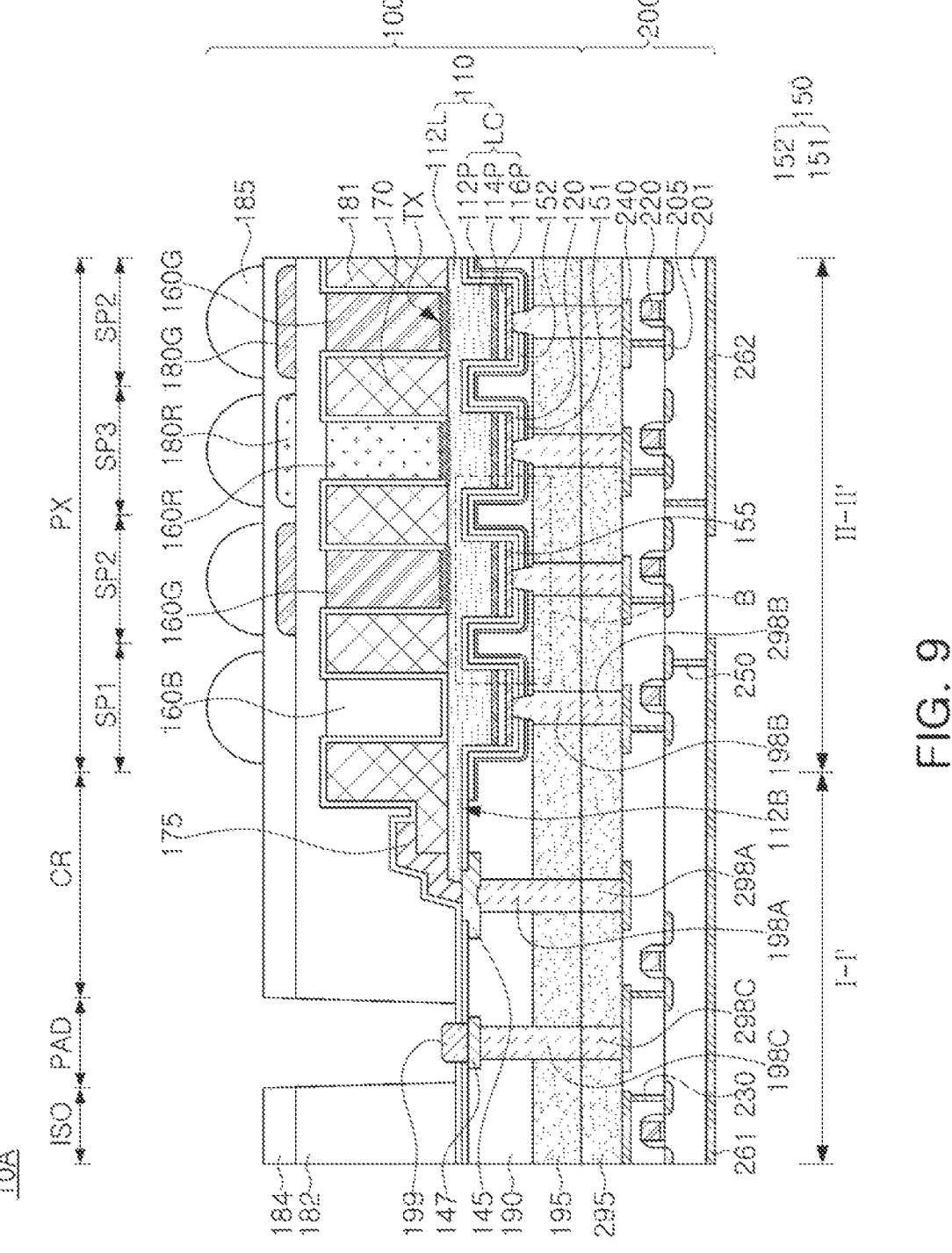
FIG. 9 is a schematic cross-sectional view of a display apparatus according to an example embodiment.

FIG. 7 is a schematic perspective view of a display apparatus according to an example embodiment, and FIG. 8 is a partially enlarged plan view (cross-sectional view) of portion "A2" of a display apparatus according to an example embodiment. FIG. 9 is a schematic cross-sectional view of a display apparatus according to an example embodiment. FIGS. 7 to 9 may be understood to be drawings, respectively corresponding to FIGS. 1 to 3.

Referring to FIGS. 7 to 9, a display apparatus 10A may be understood to be similar to the display apparatus 10 illustrated in FIGS. 1 to 3, except that upper surface regions of a first conductivity-type semiconductor layer 112L corresponding to each of the sub-pixels SP1, SP2, and SP3 have a textured surface TX, sub-pixels SP1, SP2, and SP3 are different in planar shape and arrangement, and a passivation layer 120 and a second electrode 150 of each LED cell LC have a bell-shaped reflective structure. In addition, components may be understood with reference to descriptions of the same or similar components of the display apparatus 10 illustrated in FIGS. 1 to 3 unless otherwise specified.

In the pixel array 100, an upper surface of the first conductivity-type semiconductor layer 112L may have a textured surface TX in a region corresponding to each of the sub-pixels SP1, SP2, and SP3. Light emission efficiency may be improved by the textured surface TX. The first conductivity-type semiconductor layer 112L may be coupled to a transparent insulating layer, a low refractive index layer, to more smoothly extract light from LED cells to a wavelength conversion portion of a sub-pixel.

The first to third sub-pixels SP1, SP2, and SP3 may be arranged in a Bayer pattern, similarly to those discussed above. Unlike the first to third sub-pixels SP1, SP2, and SP3 discussed above, the first to third sub-pixels SP1, SP2, and SP3 may be arranged in a diamond pentile structure in an example embodiment. For example, each pixel PX may include first and second sub-pixels SP1 and SP2 of a first column and second and third sub-pixels SP2 and SP3 of a second column, respectively arranged in a first diagonal direction, and the first and second columns may be arranged in a second diagonal direction, perpendicular to the first diagonal direction. In each pixel PX, the first to third sub-pixels SP1, SP2, and SP3 may be arranged in a diamond form. For example, the first sub-pixel SP1, the second sub-pixel SP2, the third sub-pixel SP3, and the second sub-pixel SP2 may be arranged clockwise in this order. The pixels PX may be sequentially arranged in first and second diagonal directions. In FIG. 1B, each pixel PX is illustrated as having a form in which the first to third sub-pixels SP1, SP2, and SP3 are arranged by four, but the number of the sub-pixels SP1, SP2, and SP3 constituting each pixel PX is not limited thereto.

In an example embodiment, each of the LED cells LC may be formed to have a bell-shaped reflective structure by improving the passivation layer 120 and the second electrode 150 such that light generated from an active layer 114P is directed toward an upper surface 110A of a semiconductor stack 110, a light emission surface.

Figure 10:
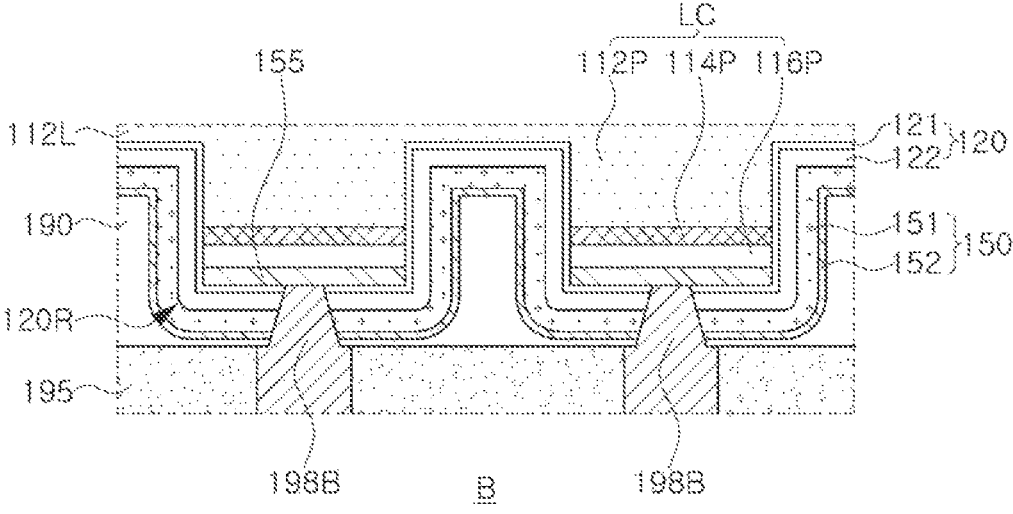
FIG. 10 is a partially enlarged cross-sectional view of portion "B" of the display apparatus illustrated in FIG. 9 according to an example embodiment.

FIG. 10 is a partially enlarged cross-sectional view of portion "B" of the display apparatus illustrated in FIG. 9.

Referring to FIG. 10, the passivation layer 120 may include a first insulating layer 121, disposed on upper surfaces and side surfaces of the LED cells LC and a lower surface 112B of the first conductivity-type semiconductor layer 112L, and a second insulating layer 122 disposed on the first insulating layer 121. The first insulating layer 121 may be conformally formed along surfaces of the LED cells LC. The second insulating layer 122 may be disposed on the first insulating layer 121 and may have a thickness, greater than a thickness of the first insulating layer 121. The second insulating layer 122 may have rounded corners around the upper surfaces of the LED cells LC to provide a surface, advantageous in light reflection. Such rounded corners may be formed by etching back the second insulating layer 122 having a relatively high thickness (see FIG. 11B). For example, the first insulating layer 121 may include a silicon nitride, an aluminum oxide, or an aluminum nitride, and the second insulating layer 122 may include a silicon oxide.

The second electrode 150 may be disposed on the passivation layer 120 and may include a reflective metal layer 151, surrounding each of the LED cells LC, and a contact electrode layer 152 disposed on the reflective metal layer 151 and connected to one region of the contact layer 155 through the second upper bonding electrode 198B and the reflective metal layer 151.

The reflective metal layer 151 may be disposed on the second insulating layer 122 with rounded corners, and thus may have a bell-shaped structure with rounded corners, advantageous in focusing light on the wavelength conversion portions 160R, 160G, and 160B and reflecting the focused light.

In addition, the passivation layer 120 and the reflective metal layer 151 disposed on the upper surface of the LED cell LC may be partially removed to form a contact opening OP_C through which the contact layer 155 is exposed, and the contact electrode layer 152 may be connected to the contact layer 155 even when the contact electrode layer 152 is formed on the reflective metal layer 151. For example, the reflective metal layer 151 may include at least one selected from the group consisting of Ag, Ni, Al, Rh, Ru, or combinations thereof, and the contact electrode layer 152 may include Ti, Cr, or a combination thereof.

In an example embodiment, the first electrode is provided as a conductive partition structure 170 on the upper surface 110A of the semiconductor stack 110, so that the second electrode 150 may be formed to cover an entire lower surface of the semiconductor stack 110. Accordingly, light may be emitted in a desired direction even in a region between the LED cells LC.

FIGS. 11A to 11E are cross-sectional views for illustrating processes in a method of manufacturing a display apparatus according to an example embodiment.

Figure 11A:
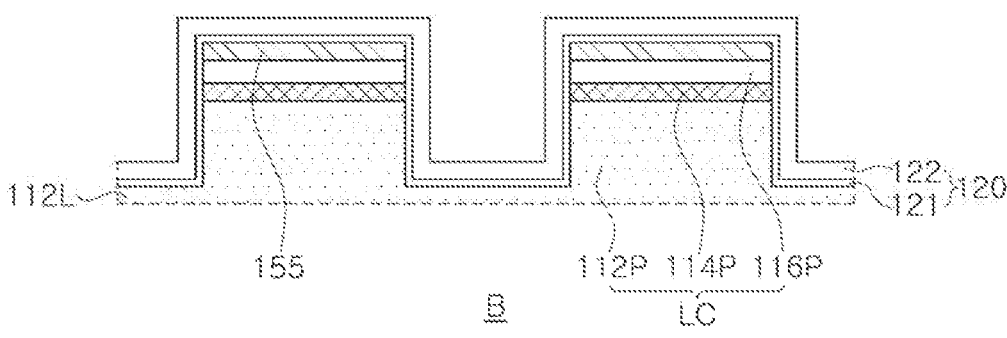
FIGS. 11A, 11B, 11C, 11D and 11E are cross-sectional views illustrating processes in a method of manufacturing a display apparatus according to an example embodiment.

Referring to FIG. 11A, a passivation layer 120 may be formed on a lower surface of the semiconductor stack 110, for example, surfaces of the LED cells LC and the lower surface 112B of the first conductivity-type semiconductor layer 112L.

A first insulating layer 121 may be formed on the upper surfaces and side surfaces of the LED cells LC and the lower surface 112B of the first conductivity-type semiconductor layer 112L, and a second insulating layer 122 may be formed on the first insulating layer 121. The first insulating layer 121 may be conformally formed along the surfaces of the LED cells LC, and the second insulating layer 122 may have a thickness, greater than a thickness of the first insulating layer 121. For example, the first insulating layer 121 may include a silicon nitride, an aluminum oxide, or an aluminum nitride, and the second insulating layer 122 may include a silicon oxide.

Figure 11B:
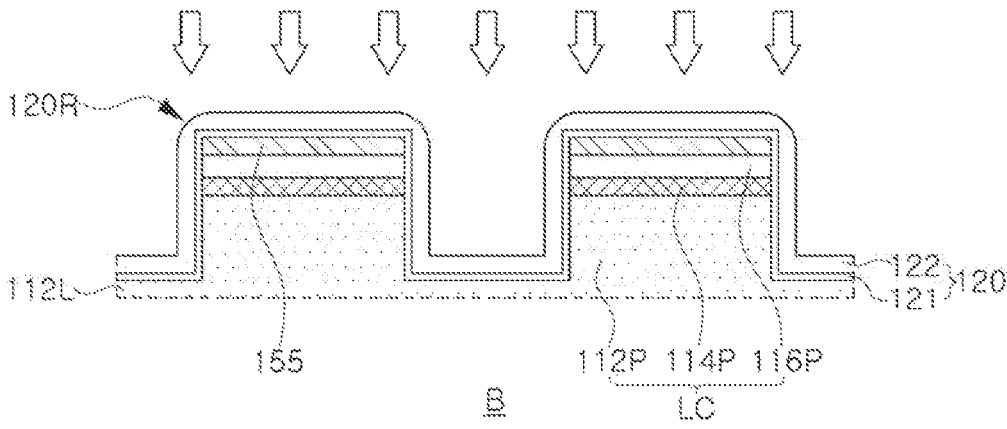

Referring to FIG. 11B, an etch-back process may be applied such that a corner portion of the second insulating layer 122 is rounded.

After the formation of the second insulating layer 122, the second insulating layer 122 may be etched back to have rounded corners around the upper surfaces of the LED cells LC. The rounded surface of the second insulating layer 122 may be advantageous in light reflection.

Figure 11C:
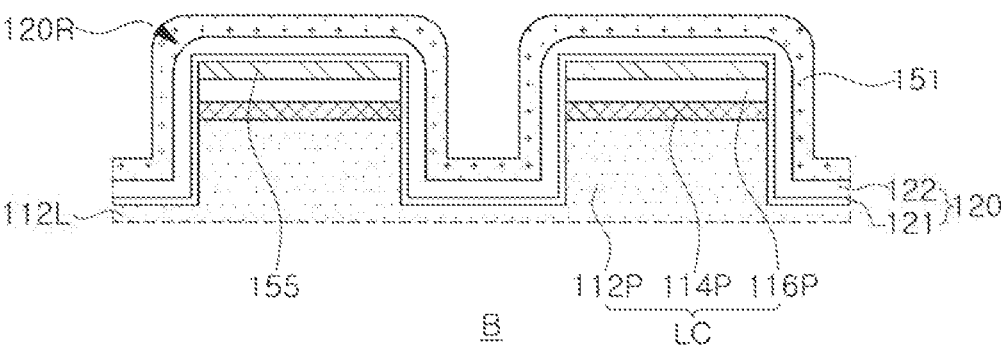

Referring to FIG. 11C, a reflective metal layer 151 may be formed on the second insulating layer 122.

A reflective metal layer 151 may be formed on the second insulating layer 122 with rounded corners to surround each of the LED cells LC. A reflective surface, provided by the reflective metal layer 151, may be provided along the surface with rounded corners. For example, the reflective metal layer 151 may include at least one selected from the group consisting of Ag, Ni, Al, Rh, Ru, or combinations thereof. In some example embodiments, the reflective metal layer 151 may be aluminum (Al).

Figure 11D:
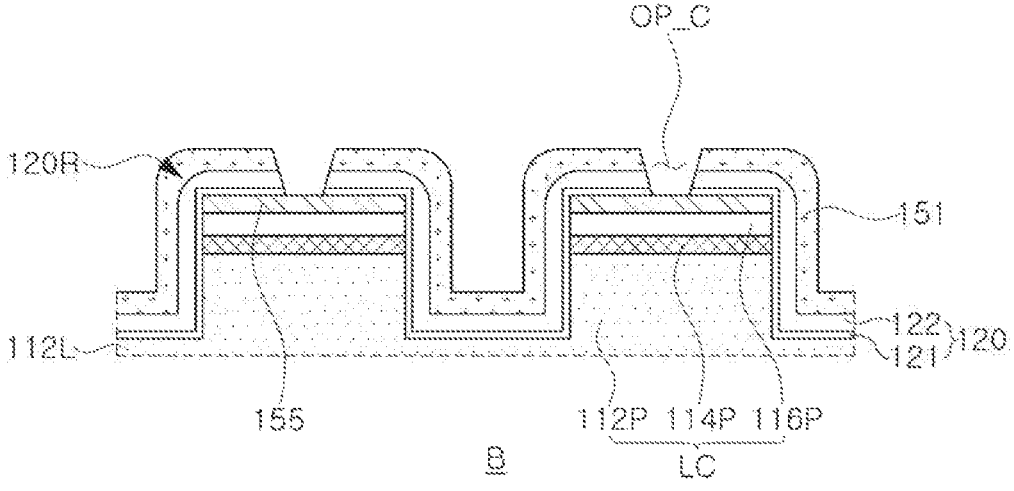

Referring to FIG. 11D, a contact opening OP_C may be formed to expose one region of the contact layer 155.

The contact opening OP_C may be formed to penetrate through the passivation layer 120 and the reflective metal layer 151 disposed on each of the upper surfaces of the LED cells LC. By partially removing the passivation layer 120 and the reflective metal layer 151 disposed on an upper surface of an LED cell LC, the contact opening OP_C may be formed to expose a contact region of the contact layer 155.

The reflective metal layer 151 may be formed before the contact electrode layer to increase a reflection effect. The reflective metal layer 151 may be disposed on the second insulating layer 122 with rounded corners, and thus may have a bell-shaped structure with rounded corners, advantageous in focusing light on the wavelength conversion portions 160R, 160G, and 160B and reflecting the focused light.

Figure 11E:
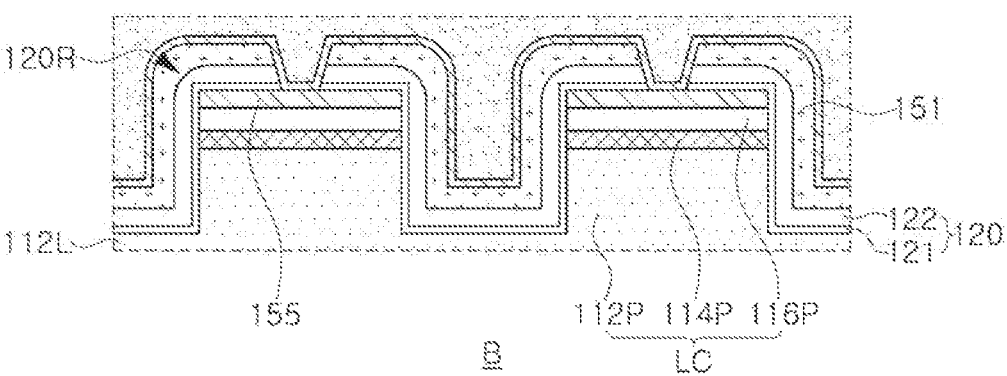

Referring to FIG. 11E, a contact electrode layer 152 may be formed on the reflective metal layer 151.

Even when the contact electrode layer 152 formed in the present process is formed on the reflective metal layer 151, the contact electrode layer 152 may be connected to the contact layer 155 through the contact opening OP_C. For example, the contact electrode layer 152 may include Ti, Cr, or a combination thereof. In an example embodiment, the first electrode is provided on the upper surface 110A of the semiconductor stack 110 as a conductive partition structure 170, so that the second electrode 150 may cover an entire lower surface of the semiconductor stack 110.

Figure 12:
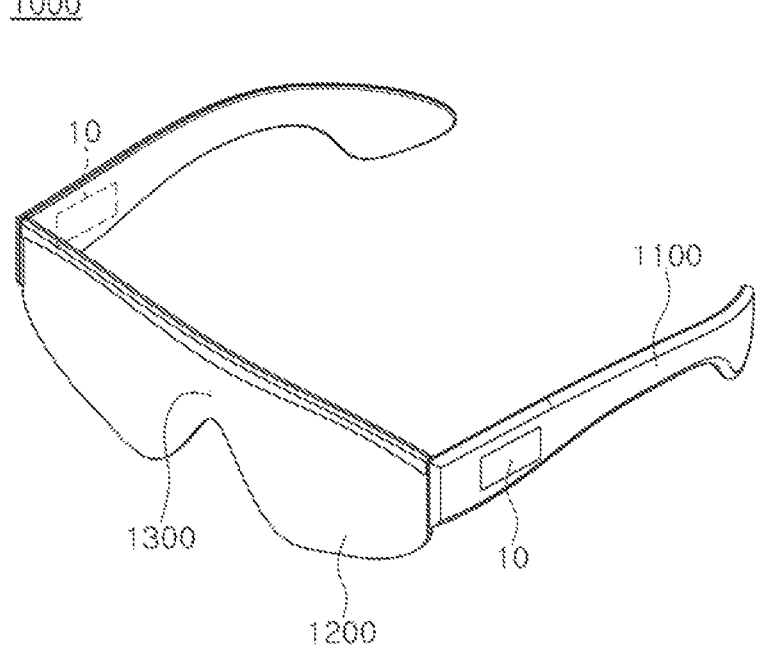
FIG. 12 is a conceptual diagram of an electronic apparatus including a display apparatus according to an example embodiment.

FIG. 12 is a conceptual diagram of an electronic apparatus including a display apparatus according to an example embodiment.

Referring to FIG. 12, an electronic apparatus 1000 according to an example embodiment may be a glasses-type display, a wearable device. The electronic apparatus 1000 may include a pair of temples 1100, a pair of optical coupling lenses 1200, and a bridge 1300. The electronic apparatus 1000 may further include a display apparatus 10 including an image generator.

The electronic apparatus 1000 may include a virtual reality (VR) display apparatus, an augmented reality (AR) display apparatus, or a mixed reality (MR) display apparatus, which may provide VR or provide both a virtual image and an external real landscape together, of a head-mounted type unit, a glasses type unit, or a goggles type unit.

The temples 1100 may extend in one direction. The temples 1100 may be spaced apart from each other to extend in parallel. The temples 1100 may be folded toward the bridge 1300. The bridge 1300 may be provided between the optical coupling lenses 1200 to connect the optical coupling lenses 1200 to each other. The optical coupling lenses 1200 may include a light guide plate. The display apparatus 10 may be disposed on each of the temples 1100, and may generate an image on the optical coupling lenses 1200. The display apparatuses 10 and 10A may be display apparatuses according to example embodiments described above with reference to FIGS. 1 to 4 or 8 to 10.

As described above, a partition structure may be formed on an optical emission side of an epitaxial layer and may be formed of a first reflective metal. Thus, luminance deviation of a cell depending on a location may be alleviated to secure uniform light emission in an entire region of a display and to improve various electrical characteristics (for example, voltage drop).

While aspects of example embodiments have been shown and described above, it will be apparent to those skilled in the art that modifications and variations could be made without departing from the scope of the present inventive concept as defined by the appended claims.

What is claimed is:

1. A display apparatus comprising:
a circuit board comprising a driving circuit; and
a pixel array comprising a plurality of pixels provided on the circuit board, each of the plurality of pixels having a plurality of sub-pixels,
wherein the pixel array comprises:
a semiconductor stack comprising a first conductivity-type semiconductor layer having an upper surface provided as a light emission surface and light-emitting diode (LED) cells arranged on a lower surface of the first conductivity-type semiconductor layer, the LED cells respectively constituting the plurality of sub-pixels, and each of the LED cells comprising an active layer and a second conductivity-type semiconductor layer stacked sequentially on the lower surface of the first conductivity-type semiconductor layer;
a conductive partition structure between sub-pixel spaces, respectively overlapping the LED cells, on the semiconductor stack, connected to the upper surface of the first conductivity-type semiconductor layer, and provided as a first electrode;
wavelength conversion portions, respectively provided in the sub-pixel spaces;
a common electrode provided on at least one side of an upper surface of the semiconductor stack and electrically connected to an edge region of the conductive partition structure and the driving circuit;

second electrodes, respectively provided on lower surfaces of the LED cells and connected to the second conductivity-type semiconductor layer, each of the second electrodes being electrically connected to the driving circuit; and a pad electrode provided on an outer side of the common electrode and electrically connected to the driving circuit.

2. The display apparatus of claim 1, further comprising a transparent insulating layer provided on an upper surface and sidewalls of the conductive partition structure and on portions of the first conductivity-type semiconductor layer exposed by the sub-pixel spaces.

3. The display apparatus of claim 2, wherein each of the portions of the first conductivity-type semiconductor layer exposed by the sub-pixel spaces has a textured surface.

4. The display apparatus of claim 2, wherein the transparent insulating layer comprises an insulating material having a first refractive index lower than a second refractive index of the second conductivity-type semiconductor layer.

5. The display apparatus of claim 1, wherein the conductive partition structure comprises any one or any combination of Ag, Cr, Ni, Ti, Al, Rh, Ru.

6. The display apparatus of claim 1, wherein a portion of the first conductivity-type semiconductor layer between the LED cells has a thickness ranging from 0.1 micrometer (μm) to 2.0 μm.

7. The display apparatus of claim 1, wherein an upper surface of the common electrode has at least a partial region exposed from the at least one side of the upper surface of the semiconductor stack.

8. The display apparatus of claim 7, further comprising an interconnect portion provided on a region adjacent to the at least one side of the upper surface of the semiconductor stack and connecting the partial region of the common electrode and the edge region of the conductive partition structure to each other.

9. The display apparatus of claim 8, wherein the edge region of the conductive partition structure has a portion extending toward the at least one side of the upper surface of the semiconductor stack from an external sidewall of the conductive partition structure.

10. The display apparatus of claim 9, wherein the portion of the edge region of the conductive partition structure is provided along the external sidewall of the conductive partition structure.

11. The display apparatus of claim 1, further comprising:

a passivation layer provided on the lower surfaces and side surfaces of the LED cells, and the lower surface of the first conductivity-type semiconductor layer, the passivation layer having a rounded edge around the lower surfaces of the LED cells;

a reflective metal layer provided on the passivation layer and surrounding each of the LED cells; and a contact electrode layer provided on the reflective metal layer and connected to one region of each of the lower surfaces of the LED cells through the reflective metal layer.

12. The display apparatus of claim 11, wherein the passivation layer comprises:

a first insulating layer provided on the lower surfaces and the side surfaces of the LED cells, and the lower surface of the first conductivity-type semiconductor layer; and a second insulating layer provided on the first insulating layer, having a thickness, greater than a thickness of the first insulating layer, and having the rounded edge around the lower surfaces of the LED cells.

13. The display apparatus of claim 12, wherein the first insulating layer comprises a silicon nitride, an aluminum oxide, or an aluminum nitride, and the second insulating layer comprises a silicon oxide.

14. The display apparatus of claim 12, wherein the reflective metal layer comprises any one or any combination of Ag, Ni, Al, Rh and Ru, the contact electrode layer comprises any one or any combination of Ti and Cr.

15. The display apparatus of claim 1, wherein the plurality of sub-pixels are arranged in a diamond structure.

16. A display apparatus comprising:

a circuit board comprising a driving circuit; and a pixel array comprising a plurality of pixels provided on the circuit board, each of the plurality of pixels having a plurality of sub-pixels, wherein the pixel array comprises:

a semiconductor stack comprising a first conductivity-type semiconductor layer having an upper surface provided as a light emission surface and light-emitting diode (LED) cells arranged on a lower surface of the first conductivity-type semiconductor layer, the LED cells respectively constituting the plurality of sub-pixels, and each of the LED cells comprising an active layer and a second conductivity-type semiconductor layer stacked sequentially on the lower surface of the first conductivity-type semiconductor layer;

a conductive partition structure between sub-pixel spaces, respectively overlapping the LED cells, on the semiconductor stack, connected to the upper surface of the first conductivity-type semiconductor layer, and provided as a first electrode, wherein textured regions of the first conductivity-type semiconductor layer, respectively exposed by the sub-pixel spaces, have textured surfaces;

a transparent insulating layer provided on an upper surface and sidewalls of the conductive partition structure and in the textured regions of the first conductivity-type semiconductor layer exposed by the sub-pixel spaces;

wavelength conversion portions, respectively provided in the sub-pixel spaces;

a common electrode provided on at least one side of an upper surface of the semiconductor stack and electrically connected to an edge region of the conductive partition structure and the driving circuit;

second electrodes, respectively provided on lower surfaces of the LED cells and connected to the second conductivity-type semiconductor layer, each of the second electrodes being electrically connected to the driving circuit; and a pad electrode provided on an outer side of the common electrode and electrically connected to the driving circuit.

17. The display apparatus of claim 16, wherein each of the LED cells has a width, greater than a width of the wavelength conversion portions.

18. The display apparatus of claim 16, wherein a height of the wavelength conversion portions is at least twice a width of the wavelength conversion portions.

19. The display apparatus of claim 16, further comprising:

a passivation layer provided on the lower surfaces and side surfaces of the LED cells, and the lower surface of the first conductivity-type semiconductor layer;

a reflective metal layer provided on the passivation layer and surrounding each of the LED cells; and a contact electrode layer provided on the reflective metal layer and connected to one region of each of the lower surfaces of the LED cells through the reflective metal layer.

20. A display apparatus comprising:

a circuit board comprising a driving circuit, a lower bonding insulating layer covering the driving circuit, and a first lower bonding electrode, second lower bonding electrodes, and a third lower bonding electrode, each penetrating through the lower bonding insulating layer and electrically connected to the driving circuit; and a pixel array comprising a plurality of pixels provided on the circuit board, each of the plurality of pixels having a plurality of sub-pixels, wherein the pixel array comprises:

a semiconductor stack comprising a first conductivity-type semiconductor layer having an upper surface provided as a light emission surface and light-emitting diode (LED) cells arranged on a lower surface of the first conductivity-type semiconductor layer, the LED cells respectively constituting the plurality of sub-pixels, and each of the LED cells comprising at least an active layer and a second conductivity-type semiconductor layer stacked sequentially on the lower surface of the first conductivity-type semiconductor layer;

a conductive partition structure between sub-pixel spaces, respectively overlapping the LED cells, on the semiconductor stack, connected to the upper surface of the first conductivity-type semiconductor layer, and provided as a first electrode;

wavelength conversion portions, respectively provided in the sub-pixel spaces;

a common electrode provided on at least one side of an upper surface of the semiconductor stack and electrically connected to an edge region of the conductive partition structure and the driving circuit;

a pad electrode provided on the same level as the common electrode;

a wiring insulating layer provided on a lower surface of the semiconductor stack to cover the LED cells;

second electrodes, respectively provided on lower surfaces of the LED cells and connected to the second conductivity-type semiconductor layer;

an upper bonding insulating layer provided on the wiring insulating layer and contacting the lower bonding insulating layer;

a first upper bonding electrode connected to the common electrode through the upper bonding insulating layer and the wiring insulating layer, and connected to the first lower bonding electrode;

second upper bonding electrodes, respectively connected to the second electrodes through the upper bonding insulating layer and the wiring insulating layer, and respectively connected to the second lower bonding electrodes; and a third upper bonding electrode connected to the pad electrode through the upper bonding insulating layer and the wiring insulating layer and connected to the third lower bonding electrode.

* * * * *